(12) United States Patent
Koyama et al.

(10) Patent No.: US 9,469,564 B2
(45) Date of Patent: Oct. 18, 2016

(54) GLASS SUBSTRATE FOR FLAT PANEL DISPLAY AND MANUFACTURING METHOD THEREOF

(71) Applicant: AvanStrate Inc., Yokkaichi-shi, Mie (JP)

(72) Inventors: Akihiro Koyama, Takarazuka (JP); Satoshi Ami, Yokkaichi (JP); Manabu Ichikawa, Yokkaichi (JP)

(73) Assignee: AvanStrate Inc., Mie (JP)

( * ) Notice: Subject to any disclaimer, the term of this patent is extended or adjusted under 35 U.S.C. 154(b) by 0 days.

(21) Appl. No.: 14/276,843

(22) Filed: May 13, 2014

(65) Prior Publication Data

US 2014/0249018 A1   Sep. 4, 2014

Related U.S. Application Data

(63) Continuation of application No. 13/537,579, filed on Jun. 29, 2012, now Pat. No. 8,853,113.

(60) Provisional application No. 61/513,260, filed on Jul. 29, 2011.

(30) Foreign Application Priority Data

Jul. 1, 2011  (JP) .................................. 2011-147759
Mar. 15, 2012  (JP) .................................. 2012-059133

(51) Int. Cl.
| | | |
|---|---|---|
| C03C 3/085 | (2006.01) | |
| C03C 3/091 | (2006.01) | |
| C03C 3/093 | (2006.01) | |
| H01L 51/00 | (2006.01) | |
| G02F 1/1333 | (2006.01) | |

(52) U.S. Cl.
CPC ............... *C03C 3/091* (2013.01); *C03C 3/093* (2013.01); *G02F 2001/133302* (2013.01); *H01L 51/0096* (2013.01)

(58) Field of Classification Search
CPC ............................. C03C 3/091; C03C 3/085
USPC .................................. 501/65, 66, 67, 69, 70
See application file for complete search history.

(56) References Cited

U.S. PATENT DOCUMENTS

| | | |
|---|---|---|
| 5,116,787 A | 5/1992 | Dumbaugh, Jr. |
| 5,116,788 A | 5/1992 | Dumbaugh, Jr. |
| 5,374,595 A | 12/1994 | Dumbaugh et al. |
| 5,801,109 A | 9/1998 | Nishizawa et al. |
| 6,417,124 B1 | 7/2002 | Peuchert et al. |
| 7,358,205 B2 | 4/2008 | Narita et al. |
| 7,833,919 B2 | 11/2010 | Danielson et al. |
| 7,838,451 B2 * | 11/2010 | Nishizawa ............. C03C 3/091 501/65 |
| 8,136,371 B2 | 3/2012 | Kato et al. |
| 2006/0003884 A1 | 1/2006 | Nishizawa et al. |
| 2007/0191207 A1* | 8/2007 | Danielson et al. ............ 501/66 |
| 2009/0270242 A1 | 10/2009 | Yanase et al. |
| 2009/0294773 A1 | 12/2009 | Ellison |
| 2011/0143908 A1 | 6/2011 | Koyama et al. |

FOREIGN PATENT DOCUMENTS

| | | |
|---|---|---|
| JP | 5-193980 A | 8/1993 |
| JP | 5-213627 A | 8/1993 |
| JP | 6263473 A | 9/1994 |
| JP | 2001-506223 A | 5/2001 |
| JP | 2002003240 A | 1/2002 |
| JP | 2003-192377 A | 7/2003 |
| JP | 2004315354 A | 11/2004 |
| JP | 2005330176 A | 12/2005 |
| JP | 2007302550 A | 11/2007 |
| JP | 2008105860 A | 5/2008 |
| JP | 2008184335 A | 8/2008 |
| JP | 200913049 A | 1/2009 |
| JP | 2009196879 A | 9/2009 |
| JP | 2009-286689 A | 12/2009 |
| JP | 2010-006649 A | 1/2010 |
| JP | 2010-215463 A | 9/2010 |
| JP | 2011020864 A | 2/2011 |
| WO | 98/27019 A1 | 6/1998 |

* cited by examiner

*Primary Examiner* — Noah Wiese

(74) *Attorney, Agent, or Firm* — Sughrue Mion, PLLC

(57) ABSTRACT

A flat panel display glass substrate according to the present invention includes a glass comprising, as expressed in mol %, 55-80% $SiO_2$, 3-20% $Al_2O_3$, 3-15% $B_2O_3$, 3-25% RO (the total amount of MgO, CaO, SrO, and BaO), and substantially no $As_2O_3$, and $Sb_2O_3$. The devitrification temperature of the glass is 1250° C. or less. The glass substrate has a heat shrinkage rate of 75 ppm or less. The heat shrinkage rate is calculated from the amount of shrinkage of the glass substrate measured after a heat treatment which is performed at a temperature rising and falling rate of 10° C./min and at 550° C. for 2 hours by the heat shrinkage rate (ppm)={the amount of shrinkage of the glass substrate after the heat treatment/the length of the glass substrate before the heat treatment}×$10^6$.

2 Claims, No Drawings

GLASS SUBSTRATE FOR FLAT PANEL DISPLAY AND MANUFACTURING METHOD THEREOF

CROSS REFERENCE TO RELATED APPLICATIONS

This application is a Continuation of U.S. application Ser. No. 13/537,579, filed Jun. 29, 2012, which claims priority from U.S. Provisional Application No. 61/513,260, filed Jul. 29, 2011, which claims priority from Japanese Patent Application No. 2011-147759 filed Jul. 1, 2011 and Japanese Patent Application No. 2012-059133 filed Mar. 15, 2012, the disclosure of each is incorporated herein by reference.

BACKGROUND OF THE INVENTION

1. Field of the Invention

The present invention relates to glass substrates for flat panel displays and methods for manufacturing the glass substrates.

2. Related Background Art

Flat panel displays with small thickness and low power consumption, such as a thin film transistor (TFT) liquid crystal display and an organic electroluminescence (EL) display, have in recent years been employed as displays for mobile devices and the like. These displays typically include a glass substrate.

There are the following types of TFTs: an amorphous silicon (α-Si) TFT; and a polysilicon (p-Si) TFT. The p-Si TFT is advantageous over the α-Si TFT in terms of screen resolution, display durability, display thickness and weight, and power consumption, and the like, i.e., the p-Si TFT can provide a beautiful screen with a higher resolution, a display with a higher durability, a display with a smaller thickness and a lower weight, and lower power consumption. Conventionally, however, a high temperature treatment is required in production of the p-Si M. Therefore, the glass substrate undergoes heat shrinkage and heat shock during production of the p-Si TFT, and therefore, glass other than silica glass cannot be employed. As a result, it is difficult to apply the p-Si TFT to a liquid crystal display.

However, the low-temperature polysilicon (LTPS) TFT, for which the heat treatment is performed at lower temperature, has in recent years been developed, and therefore, the p-Si TFT has been applicable to the flat panel display. As a result, the display of a small device (e.g., a mobile device, etc.) can have a beautiful screen with a high resolution.

Note that the heat treatment in production of the p-Si TFT still requires a temperature of as high as 400 to 600° C. Most of the conventional glass substrates for displays do not have a sufficiently high strain point, and therefore, are likely to undergo significant heat shrinkage due to the heat treatment in production of the p-Si TFT, leading to a non-uniform pixel pitch. Moreover, in recent years, there has been a demand for higher and higher resolutions. Therefore, in order to reduce such a non-uniform pixel pitch, it is highly desirable to reduce the heat shrinkage of the glass substrate during production of the display. Conventionally, glass substrates for displays which have been developed in view of the heat shrinkage problem have been reported (JP 2002-3240A, JP 2004-315354A, and JP 2007-302550A).

SUMMARY OF THE INVENTION

Here, the heat shrinkage of the glass substrate can be reduced by increasing characteristic (low-temperature viscosity characteristic) temperatures in the low temperature viscosity range, typified by a glass transition temperature (hereinafter referred to as a "Tg" and a strain point (the "Tg and strain point" will be described hereinafter as typical examples of the low-temperature viscosity characteristic temperature in this specification). However, if the composition of a glass is modified only for the purpose of increasing the Tg and strain point of the glass, the devitrification resistance of the glass is likely to deteriorate. If the devitrification resistance deteriorates, i.e., the devitrification temperature increases, so that the liquidus viscosity decreases, the flexibility of the production method also decreases. If the devitrification temperature increases, so that the liquidus viscosity decreases, it is difficult to produce the glass substrate, for example, by the overflow downdraw process.

Therefore, it is an object of the present invention to provide a glass substrate for flat panel displays in which the amount of heat shrinkage is decreased and a decrease in devitrification resistance is suppressed, and in which a non-uniform pixel pitch does not occur even if the glass substrate is employed in a display to which the p-Si TFT is applied.

Solution to Problem

A first example flat panel display glass substrate on which a p-Si TFT can be formed according to the present invention includes a glass comprising, as expressed in mol %:
55-80% $SiO_2$;
3-20% $Al_2O_3$;
3-15% $B_2O_3$;
3-25% RO, where RO represents the total amount of MgO, CaO, SrO, and BaO; and
substantially no $As_2O_3$ and $Sb_2O_3$,
wherein
the devitrification temperature of the glass is 1250° C. or less, and
the glass substrate has a heat shrinkage rate of 75 ppm or less.

The heat shrinkage rate is calculated from the amount of shrinkage of the glass substrate measured after a heat treatment which is performed at a temperature rising and falling rate of 10° C./min and at 550° C. for 2 hours by:

the heat shrinkage rate (ppm)={the amount of shrinkage of the glass substrate after the thermal treatment/the length of the glass substrate before the heat treatment}×$10^6$ The "heat shrinkage rate" as used hereinafter has the same meaning.

Note that, "substantially no $As_2O_3$ and $Sb_2O_3$" means that a material comprising $As_2O_3$ and $Sb_2O_3$ as main components is not added to the glass material, and the contents of $As_2O_3$ and $Sb_2O_3$ are respectively preferably 0.1% or less, more preferably 0.05% or less, and even more preferably 0.01% or less. The phrase "substantially no X (X: a predetermined component) is comprised" means the same in the following description.

A second example flat panel display glass substrate on which a p-Si TFT can be formed according to the present invention includes a glass comprising, as expressed in mol %:
55-80% $SiO_2$;
3-20% $Al_2O_3$;
3-15% $B_2O_3$;
3-25% RO, where RO represents the total amount of MgO, CaO, SrO, and BaO; and
substantially no $As_2O_3$ and $Sb_2O_3$, wherein the devitrification temperature of the glass is 1250° C. or less, and the glass substrate has a heat shrinkage rate of 75 ppm or less as measured after a heat treatment in which the glass substrate is kept at Tg for 30 min, then cooled at a rate of 100° C./min until the temperature thereof reaches Tg−100° C., then cooled until the temperature reaches room temperature, and then kept at 550° C. for 2 hours, wherein a rising and falling temperature rate is 10° C./min.

A method for manufacturing a flat panel display glass substrate on which a p-Si TFT can be formed, includes:

a melting step of melting a glass material for a glass comprising, as expressed in mol %, 55-80% $SiO_2$, 3-20% $Al_2O_3$, 3-15% $B_2O_3$, and 3-25% RO (the total amount of MgO, CaO, SrO, and BaO), and substantially no $As_2O_3$ and $Sb_2O_3$, and the devitrification temperature of the glass being 1250° C. or less, to produce a molten glass, a forming step of forming the molten glass into a glass plate, and an annealing step of annealing the glass plate, wherein the heat shrinkage rate of the glass plate is 75 ppm or less.

A flat panel display glass substrate according to the present invention includes a glass comprising, as expressed in mol %:

55-80% $SiO_2$;
3-20% $Al_2O_3$;
3-15% $B_2O_3$;
3-25% RO, where RO represents the total amount of MgO, CaO, SrO, and BaO; and
substantially no $As_2O_3$ and $Sb_2O_3$,
wherein the devitrification temperature of the glass is 1250° C. or less, and the glass substrate has a heat shrinkage rate of 75 ppm or less, According to the present invention, a glass substrate having excellent properties can be provided in which the devitrification resistance is not deteriorated, and in which the occurrence of the heat shrinkage caused by a heat treatment during production of a display is suppressed, and therefore, the non-uniformity of the pixel pitch does not occur, even when the glass substrate is employed in a display to which the p-Si TFT is applied.

DETAILED DESCRIPTION OF THE INVENTION

A display glass substrate according to this embodiment includes a glass which comprises, as expressed in mol %, 55-80% $SiO_2$, 3-20% $Al_2O_3$, 3-15% $B_2O_3$, and 3-25% RO (the total amount of MgO, CaO, SrO, and BaO), and whose devitrification temperature is 1250° C. or less. The display glass substrate according to this embodiment has a heat shrinkage rate of 75 ppm or less, preferably 60 ppm or less. The heat shrinkage rate of the glass substrate may be reduced by increasing the Tg and strain point of the glass. Moreover, the heat shrinkage rate of the glass substrate may be reduced not only by increasing the Tg and strain point due to adjustment of a glass composition but also by appropriately adjusting conditions under which the glass is annealed. If the glass composition is improved only by increasing the Tg and strain point of the glass, then the devitrification temperature may increase and the devitrification resistance may decrease. However, the glass substrate of this embodiment can achieve a heat shrinkage rate of 75 ppm or less, more preferably 60 ppm or less by appropriately combining the adjustment of the glass composition and the adjustment of conditions under which the glass is annealed. Therefore, the glass substrate which simultaneously has a heat shrinkage rate of 75 ppm or less, preferably 60 ppm or less, and a devitrification temperature of 1250° C. or less can be achieved.

The glass included in the glass substrate of this embodiment can have excellent characteristics in which the heat shrinkage caused by a heat treatment during production of a flat panel display is reduced, and therefore, the non-uniformity of the pixel pitch does not occur. Moreover, by the devitrification temperature being reduced to 1250° C. or less, effects can be obtained that it is easy for the glass included in the glass substrate of this embodiment to be formed using a downdraw process. In addition, since the glass included in the glass substrate of this embodiment comprises substantially no $As_2O_3$ and $Sb_2O_3$ in the glass composition, the environmental load can be reduced.

Also, the glass included in the glass substrate of this embodiment may comprise 5% or less ZnO as an optional component. In this case, it is preferable that the contents in mol % of $SiO_2$ and $Al_2O_3$ satisfy $SiO_2+Al_2O_3 \geq 70\%$, more preferably $SiO_2+Al_2O_3 \geq 75\%$, and the contents in mol % of RO, ZnO, and $B_2O_3$ satisfy $RO+ZnO+B_2O_3=7-30\%$, more preferably 7-25%.

As described above, the heat shrinkage rate may be reduced by appropriately adjusting a glass composition and adjusting conditions under which the glass is produced. Note that the conditions under which the glass is produced specifically means that when the glass is annealed, the glass is cooled at a necessarily and sufficiently low rate in a temperature region of Tg to Tg−100° C. If the heat shrinkage rate is 75 ppm or less, preferably 65 ppm or less, and more preferably 60 ppm or less, even when the glass substrate of this embodiment is employed in a display to which the p-Si TFT is applied, and moreover, the display has a high resolution, the non-uniformity of the pixel pitch can be sufficiently reduced. In order to reliably reduce the non-uniformity of the pixel pitch, the heat shrinkage rate is preferably 55 ppm or less, more preferably 50 ppm or less, even more preferably 45 ppm or less, still even more preferably 43 ppm or less, still even more preferably 40 ppm or less, and still even more preferably 38 ppm or less. In other words, the heat shrinkage rate is 0-75 ppm, preferably 0-65 ppm, more preferably 0-60 ppm, even more preferably 0-55 ppm, still even more preferably 0-50 ppm, still even more preferably 0-45 ppm, still even more preferably 0-43 ppm, still even more preferably 0-40 ppm, and still even more preferably 0-38 ppm. Note that, in order to cause the heat shrinkage rate to be zero ppm, it may be necessary to perform the annealing for a considerably long time or perform a heat shrinkage reduction treatment (off-line annealing) after the annealing, leading to a reduction in productivity and an increase in cost. In view of productivity and cost, the heat shrinkage rate is, for example, 3-75 ppm, preferably 5-75 ppm, more preferably 5-65 ppm, even more preferably 8-55 ppm, still even more preferably 8-50 ppm, still even more preferably 10-45 ppm, still even more preferably 10-43 ppm, still even more preferably 10-40 ppm, and still even more preferably 15-38 ppm.

The glass included in the glass substrate of this embodiment has a devitrification temperature of 1250° C. or less. As described above, if the devitrification temperature is 1250° C. or less, the glass included in the glass substrate of this embodiment can be advantageously easily formed by a downdraw process. As a result, the surface quality of the glass substrate can be improved, and the manufacturing cost of the glass substrate can be reduced. If the devitrification temperature is excessively high, devitrification is likely to occur, i.e., the devitrification resistance decreases. Therefore, the devitrification temperature of the glass included in the glass substrate of this embodiment preferably 1230° C. or less, more preferably 1220° C. or less, even more preferably 1210° C. or less, and still even more preferably 1200° C. or less. On the other hand, in order to achieve properties of a substrate for flat panel displays, such as a high strain point and low density, the devitrification temperature of the glass included in the glass substrate is preferably 1050-1250° C., more preferably 1110-1250° C., even more preferably 1150-1240° C., still even more preferably 1160-1230° C., and still even more preferably 1170-1220° C.

The glass included in the glass substrate of this embodiment may have a strain point of 660° C. or more. In order to more reliably reduce the heat shrinkage during production of a flat panel display, the strain point is preferably 665° C. or more, more preferably 675° C. or more, even more preferably 680° C. or more, still even more preferably 685° C. or more, still even more preferably 690° C. or more, still even more preferably 695° C. or more, and still even more preferably 700° C. or more.

The glass included in the glass substrate of this embodiment preferably has a liquidus viscosity of $10^{4.0}$ dPa·s or more, more preferably $10^{4.5}$ dPa·s or more. If the liquidus viscosity is $10^{4.0}$ dPa·s or more, the glass can be easily formed by a float process. If the liquidus viscosity is $10^{4.5}$ dPa·s or more, the ease of forming is further improved. Therefore, if the liquidus viscosity is within such a range, the glass included in the glass substrate of this embodiment can be easily formed by a downdraw process (particularly, the overflow downdraw process). As a result, the surface quality of the glass substrate can be improved and the manufacturing cost of the glass substrate can be reduced. The liquidus viscosity is more preferably $10^{4.5}$-$10^{6.0}$ dPa·s, more preferably $10^{4.5}$-$10^{5.9}$ dPa·s, even more preferably $10^{4.6}$-$10^{5.8}$ dPa·s, still even more preferably $10^{4.6}$-$10^{5.7}$ dPa·s, still even more preferably $10^{4.7}$-$10^{5.7}$ dPa·s, still even more preferably $10^{4.8}$-$10^{5.6}$ dPa·s, and still even more preferably $10^{4.9}$-$10^{5.5}$ dPa·s.

Other properties of the glass included in the glass substrate of this embodiment are preferably within the following ranges.

It is preferable that the glass included in the glass substrate of this embodiment has good meltability. If the meltability deteriorates, i.e., the melting temperature increases, then the load on a melting bath increases, and further energy required for melting increases, resulting in an increase in manufacturing cost. Also, if the melting temperature is high, then when a glass material is electrically melted, a current flows through heat-resistant bricks forming a melting bath instead of flowing through the glass, likely leading to damage to the melting bath. Note that the meltability of a glass may be evaluated by glass temperature (melting temperature), where the viscosity is $10^{2.5}$ dPa·s. The glass included in the glass substrate of this embodiment preferably has a melting temperature of 1680° C. or less. If the melting temperature is 1680° C. or less, the glass substrate of this embodiment can have good meltability. However, if the melting temperature is excessively low, the Tg and strain point are likely to be low. Therefore, in order to achieve a high Tg and strain point, the melting temperature needs to be fairly high. Therefore, the melting temperature is preferably 1550-1650° C., more preferably 1550-1645° C., even more preferably 1580-1640° C., still even more preferably 1590-1630° C., and still even more preferably 1600-1620° C.

The average coefficient of thermal expansion within the range of 100-300° C. of the glass included in the glass substrate of this embodiment is preferably less than $37 \times 10^{-7} K^{-1}$, more preferably no less than $28 \times 10^{-7} K^{-1}$ and less than $36 \times 10^{-7} K^{-1}$, even more preferably no less than $30 \times 10^{-7} K^{-1}$ and less than $35 \times 10^{-7} K^{-1}$, still even more preferably no less than $31 \times 10^{-7} K^{-1}$ and less than $34.5 \times 10^{-7} K^{-1}$, and still even more preferably no less than $32 \times 10^{-7} K^{-1}$ and less than $34 \times 10^{-7} K^{-1}$. If the coefficient of thermal expansion is excessively high, the heat shock or the amount of heat shrinkage increases in the heat treatment during production of a display. On the other hand, if the coefficient of thermal expansion is excessively low, it is difficult to match the coefficients of thermal expansion of peripheral materials, such as a metal and an organic adhesive, formed on the glass substrate during production of a display, and therefore, the peripheral materials are likely to come off the glass substrate. In the p-Si TFT production process, rapid heating and rapid cooling are repeatedly performed, and therefore, greater heat shock is applied to the glass substrate. When the glass substrate is large, a temperature difference (temperature distribution) is likely to occur in the heat treatment step, leading to an increase in the probability of destruction of the glass substrate. If the coefficient of thermal expansion is within the aforementioned range, thermal stress caused by a difference in thermal expansion can be reduced, resulting in a decrease in the probability of destruction of the glass substrate in the heat treatment step. Note that when importance is put on the matching with the coefficients of thermal expansion of the peripheral materials, such as a metal and an organic adhesive, formed on the glass substrate, the average coefficient of thermal expansion within the range of 100-300° C. of the glass included in the glass substrate is preferably less than $55 \times 10^{-7} K^{-1}$, more preferably less than $40 \times 10^{-7} K^{-1}$, even more preferably no less than $28 \times 10^{-7} K^{-1}$ and less than $40 \times 10^{-7} K^{-1}$, still even more preferably no less than $30 \times 10^{-7} K^{-1}$ and less than $39 \times 10^{-7} K^{-1}$, still even more preferably no less than $32 \times 10^{-7} K^{-1}$ and less than $38 \times 10^{-7} K^{-1}$, and still even more preferably no less than $34 \times 10^{-7} K^{-1}$ and less than $38 \times 10^{-7} K^{-1}$.

If the Tg is excessively low, the heat resistance decreases, and in the heat treatment step, the heat shrinkage increases. Therefore, the Tg of the glass substrate of this embodiment is preferably 720° C. or more, more preferably 740° C. or more, even more preferably 745° C. or more, still even more preferably 750° C. or more, still even more preferably 755° C. or more, and still even more preferably 760° C. or more.

If the density is excessively high, it may be difficult to reduce the weight of the glass substrate, and therefore, it may be difficult to reduce the weight of a display. Therefore, the density of the glass substrate of this embodiment is preferably 2.6 g/cm³ or less, more preferably less than 2.5 g/cm³, even more preferably 2.45 g/cm³ or less, still even more preferably 2.42 g/cm³ or less, and still even more preferably 2.4 g/cm³ or less. In particular, in order to reduce the weight of the glass substrate for a flat display or an organic EL display including the p-Si TFT, the density is preferably less than 2.5 g/cm³, more preferably 2.45 g/cm³ or less, even more preferably 2.42 g/cm³ or less, and still even more preferably 2.4 g/cm³ or less.

If the specific resistance of a glass melt is excessively low, then when a glass material is electrically melted, the value of a current required for melting the glass material is excessively large. Therefore, there may be constraints on equipment. Moreover, the electrode is disadvantageously much consumed. On the other hand, if the specific resistance is excessively high, then when the glass material is melted, a current flows through heat-resistant bricks forming a melting bath, likely leading to damage to the melting bath. Therefore, the specific resistance at 1550° C. of the glass included in the glass substrate of this embodiment is preferably 50-300 Ω·cm, more preferably 50-250 Ω·cm, even more preferably 80-240 Ω·cm, and still even more preferably 100-230 Ω·cm.

If the Young's modulus and specific modulus of elasticity (Young's modulus/density) are excessively low, the glass substrate is bent or warped by its own weight during production of a display, likely leading to damage to the glass substrate. In particular, if the glass substrate is large (e.g., 2000 mm or more wide), the damage caused by the bending or warp becomes significant. Therefore, the Young's modulus of the glass substrate of this embodiment is preferably 70 GPa or more, more preferably 73 GPa or more, even more preferably 74 GPa or more, and still even more preferably 75 GPa or more. The specific modulus of elasticity of the glass substrate of this embodiment is preferably 28 GPa or more, more preferably 29 GPa or more, even more preferably 30 GPa or more, and still even more preferably 31 GPa or more.

Next, components of the glass included in the glass substrate of this embodiment will be described. Note that "mol %" is simply hereinafter shortened to "%".

($SiO_2$)

$SiO_2$ is a skeltal and essential component. If the amount of $SiO_2$ is excessively small, the acid resistance may decrease, the Tg and strain point may decrease, the coefficient of thermal expansion may increase, and the buffered hydrofluoric acid (BHF) resistance may decrease. It may also be difficult to reduce the density. On the other hand, if the amount of $SiO_2$ is excessively large, the melting temperature may be significantly high, and therefore, it may be difficult to melt and form the glass. The devitrification resistance may also decrease. Also, when the glass is slimmed down, the etching rate cannot be sufficiently increased. Therefore, the $SiO_2$ content is preferably 55-80%, more preferably 60-78%, even more preferably 62-78%, still even more preferably 65-78%, and still even more preferably 65-75%. Note that when the glass substrate comprises only less than 3% SrO+BaO in order to further reduce the weight, the $SiO_2$ content is more preferably 67-73%, even more preferably 69-72%. In order to sufficiently increase the etching rate when the glass is slimmed down, the $SiO_2$ content is more preferably 62-78%, even more preferably 62-74%, and still even more preferably 64-70%. On the other hand, when the glass substrate comprises 3% or more SrO+BaO, the $SiO_2$ content is more preferably 65-73%, even more preferably 66-71%.

($Al_2O_3$)

$Al_2O_3$ is an essential component which reduces phase separating and increases the Tg and strain point. If the amount of $Al_2O_3$ is excessively small, the glass is likely to undergo phase separating. Also, the Tg and strain point may decrease, so that the heat resistance may decrease, the heat shrinkage rate may increase, the Young's modulus and the acid resistance may decrease. Also, the rate of etching the glass cannot be sufficiently increased. On the other hand, if the amount of $Al_2O_3$ is excessively large, the devitrification temperature of the glass increases, so that the devitrification resistance decreases, and therefore, the ease of forming deteriorates. Therefore, the $Al_2O_3$ content is preferably 3-20%, more preferably 5-18%, and even more preferably 5-15%. Note that when the glass substrate comprises only less than 3% SrO+BaO in order to further reduce the weight, the $Al_2O_3$ content is more preferably 7-13%, even more preferably 9-12%. In order to sufficiently increase the etching rate when the glass is slimmed down, the $Al_2O_3$ content is more preferably 7-15%, even more preferably 9-14%, and still even more preferably 10-14%. On the other hand, when the glass substrate comprises 3% or more SrO+BaO, the $Al_2O_3$ content is more preferably 8-15%, even more preferably 10-14%.

($B_2O_3$)

$B_2O_3$ is an essential component which reduces the viscosity characteristic (high-temperature viscosity characteristic) temperature in a high temperature region, typified by the melting temperature, to improve the meltability (the "melting temperature" will be described hereinafter as a typical example of the "high-temperature viscosity characteristic temperature" in this specification). If the amount of $B_2O_3$ is excessively small, the meltability may decrease, the BHF resistance may decrease, the devitrification resistance may decrease, and the coefficient of thermal expansion may increase. Also, the density may increase, so that it may be difficult to reduce the density. On the other hand, if the amount of $B_2O_3$ is excessively large, the Tg and strain point may decrease, the acid resistance may decrease, and the Young's modulus may decrease. Also, $B_2O_3$ evaporates during melting of the glass, so that the non-uniformity of the glass may become significant, and therefore, a cord is likely to occur. Therefore, the $B_2O_3$ content is preferably 3-15%, more preferably 3-13%, and even more preferably 3-10%. Note that when the glass substrate comprises only less than 3% SrO+BaO in order to further reduce the weight, the $B_2O_3$ content is more preferably no less than 3% and less than 9.5%, even more preferably no less than 3.5% and less than 9.2%, still even more preferably no less than 4% and less than 8.9%, still even more preferably 5-8.5%, and still even more preferably 6-8%. Moreover, in order to prevent the increase of the devitrification temperature, the $B_2O_3$ content is more preferably 5-13%, even more preferably 5-12%, and still even more preferably 6% to less than 10% (no less than 6% and less than 10%). On the other hand, when the glass substrate comprises 3% or more SrO+BaO, the $B_2O_3$ content is more preferably 3-9%, even more preferably 4-8%.

(MgO)

MgO is a component which improves the meltability. MgO is also a component which increases the density more slowly than other alkaline-earth metals. Therefore, if the MgO content is relatively increased, the density of the glass can be easily reduced. In the glass substrate of this embodiment, MgO is not essential. However, if MgO is comprised, the meltability can be increased and the occurrence of chips can be reduced. Therefore, MgO may be comprised. However, if the amount of MgO is excessively large, the Tg and strain point may decrease, the heat resistance may decrease, the acid resistance may decrease, and the Young's modulus may decrease. Also, the devitrification temperature may increase, i.e., the devitrification resistance may decrease, and therefore, it may be difficult to employ a downdraw process. Therefore, in the glass substrate of this embodiment, the MgO content is preferably 0-15%, more preferably 0-10%. Note that when the glass substrate comprises only less than 3% SrO+BaO in order to further reduce the weight, the MgO content is more preferably 0-5%, even more preferably 0% to less than 2% (no less than 0% and less than 2%), still even more preferably 0-1.5%, still even more preferably 0-1%, and still even more preferably 0-0.5%, and still even more preferably, substantially no MgO is comprised. On the other hand, when the glass substrate comprises 3% or more SrO+BaO, the MgO content is more preferably 1-9%, even more preferably 2-8%.

(CaO)

CaO is a component which is effective in improving the meltability of a glass without rapidly increasing the devitrification temperature of the glass. CaO is also a component which increases the density more slowly than other alkaline-earth metals. Therefore, if the CaO content is relatively increased, the density of the glass can be easily reduced. If the amount of CaO is excessively small, the meltability and devitrification resistance are likely to decrease due to an increase in the viscosity at high temperature. On the other hand, if the amount of CaO is excessively large, the coefficient of thermal expansion is likely to increase. For these reasons, the CaO content is preferably 0-20%, more preferably 0-18%. Note that when the glass substrate comprises only less than 3% SrO+BaO in order to further reduce the weight, the CaO content is more preferably 3.6-16%, even more preferably 4-16%, still even more preferably 6-16%, still even more preferably more than 7% to 16% (more than 7% and 16% or less), still even more preferably 8-13%, and still even more preferably 9-12%. On the other hand, when the glass substrate comprises 3% or more SrO+BaO, the CaO content is more preferably 0-10%, even more preferably 0-5%, and still even more preferably 0-3%.

(SrO)

SrO is a component which can decrease the devitrification temperature of a glass. SrO is not an essential component, but if SrO is comprised, the devitrification resistance and meltability can be improved, and therefore, SrO may be comprised. However, if the amount of SrO is excessively large, the density increases. Therefore, if it is desirable that the density be reduced, preferably substantially no SrO is comprised. Therefore, in the glass substrate of this embodiment, the SrO content is preferably 0-10%, more preferably 0-8%. Note that, in order to further reduce the weight, the SrO content is preferably less than 3%, more preferably 2% or less, even more preferably 1% or less, and still even more preferably 0.5% or less, and still even more preferably, substantially no SrO is comprised. In other words, the SrO content is preferably 0% to less than 3% (no less than 0% and less than 3%), more preferably 0-2%, even more preferably 0-1%, and still even more preferably 0-0.5%, and still even more preferably, substantially no SrO is comprised. On the other hand, if it is desirable that the meltability be improved, the SrO content is more preferably 1-8%, even more preferably 3-8%.

(BaO)

BaO is a component which improves the devitrification resistance and meltability. Also, if BaO is comprised, the coefficient of thermal expansion increases and the density excessively increases. Therefore, in the glass substrate of this embodiment, the BaO content is preferably 0-10%, more preferably 0-5%, even more preferably 0-2%, and still even more preferably 0-1%. In view of the environmental load problem, more preferably substantially no BaO is comprised.

($Li_2O$, $Na_2O$)

$Li_2O$ and $Na_2O$ are components which improve the meltability of a glass, but increases the coefficient of thermal expansion of the glass, leading to damage to a substrate in a heat treatment during production of a display, or significantly decreases the Tg and strain point of the glass, leading to an excessive decrease in the heat resistance. Therefore, in the glass substrate of this embodiment, the $Li_2O$ and $Na_2O$ content is preferably 0-0.3%, more preferably 0-0.2%, and even more preferably 0-0.1%, and still even more preferably, substantially no $Li_2O$ or $Na_2O$ is comprised.

($K_2O$)

$K_2O$ is a component which increases the basicity of a glass to impart refinability to the glass. $K_2O$ is also a component which improves the meltability and decreases the specific resistance of a glass melt. Therefore, $K_2O$ is not an essential component, but if $K_2O$ is comprised, the specific resistance of a glass melt can be decreased, and the meltability and the clarity can be increased. However, if the amount of $K_2O$ is excessively large, the coefficient of thermal expansion may increase, and the strain point and Tg may significantly decrease, leading to an excessive decrease in the heat resistance. Therefore, in the glass substrate of this embodiment, the $K_2O$ content is preferably 0-0.8%, more preferably 0.01-0.5%, and even more preferably 0.1-0.3%.

($ZrO_2$, $TiO_2$)

$ZrO_2$ and $TiO_2$ are components which increase the chemical durability and the Tg and strain point of a glass. $ZrO_2$ and $TiO_2$ are not essential components, but if $ZrO_2$ and $TiO_2$ are comprised, the Tg and strain point can be increased and the acid resistance can be improved. However, if the amounts of $ZrO_2$ and $TiO_2$ are excessively large, the devitrification temperature significantly increases, and therefore, the devitrification resistance and the ease of forming may decrease. In particular, crystals of $ZrO_2$ may precipitate in a cooling step, and these inclusions may cause a deterioration in the quality of the glass. $TiO_2$ is also a component which adds color to a glass, and therefore, is not suitable for display substrates. For these reasons, in the glass substrate of this embodiment, the $ZrO_2$ and $TiO_2$ contents are each preferably 0-5%, more preferably 0-3%, even more preferably 0-2%, still even more preferably 0-1%, and still even more preferably less than 0.5%. Still even more preferably, the glass substrate of this embodiment comprises substantially no $ZrO_2$ or $TiO_2$.

(ZnO)

ZnO is a component which improves the BHF resistance and meltability, and therefore, may be comprised, but is not an essential component. However, if the amount of ZnO is excessively large, the devitrification temperature may increase, the Tg and strain point may decrease, and the density may increase. Therefore, in the glass substrate of this embodiment, the ZnO content is preferably 5% or less, more preferably 3% or less, even more preferably 2% or less, and still even more preferably 1% or less. Still even more preferably, the glass substrate of this embodiment comprises substantially no ZnO. In other words, the ZnO content is preferably 0-5%, more preferably 0-3%, even more preferably 0-2%, and still even more preferably 0-1%. Still even more preferably, the glass substrate of this embodiment comprises substantially no ZnO.

($P_2O_5$)

$P_2O_5$ is a component which decreases the melting temperature to improve the meltability, and therefore, may be comprised, but is not an essential component. However, if the amount of $P_2O_5$ is excessively large, $P_2O_5$ evaporates during melting of the glass, so that the non-uniformity of the glass becomes significant, and therefore, a cord is likely to occur. Also, it is likely that the Tg and strain point decreases, the acid resistance significantly deteriorates, and the glass turns into milky white. Therefore, in the glass substrate of this embodiment, the $P_2O_5$ content is preferably 3% or less, more preferably 1% or less, and even more preferably 0.5% or less. Still even more preferably, the glass substrate of this embodiment comprises substantially no $P_2O_5$. In other words, the $P_2O_5$ content is preferably 0-3%, more preferably 0-1%, and even more preferably 0-0.5%. Still even more preferably, the glass substrate of this embodiment comprises substantially no $P_2O_5$.

($La_2O_3$)

$La_2O_3$ may be comprised. However, if the among of $La_2O_3$ is excessively large, the devitrification temperature may increase, and the density may increase. Therefore, the $La_2O_3$ content is preferably 0-1%, more preferably 0-0.5%, and even more preferably 0-0.1%. Still even more preferably, the glass substrate of this embodiment comprises substantially no $La_2O_3$.

(Refining Agent)

Any refining agent that has low environmental load and imparts excellent clarity to a glass may be employed, i.e., the present invention is not limited to any particular refining agent. For example, the refining agent may be at least one selected from the group consisting of metal oxides of Sn, Fe, Ce, Tb, Mo, and W. If the amount of the refining agent is excessively small, the foam quality deteriorates. Therefore, the amount of the refining agent added is, for example, within the range of 0.01-1%, preferably 0.05-1%, more preferably 0.05-0.5%, even more preferably 0.05-0.3%, and still even more preferably 0.05-0.2%, although it depends on the type of the refining agent or the composition of the glass. The refining agent is preferably $SnO_2$. However, $SnO_2$ is a component which decreases the devitrification resistance of a glass. Therefore, for example, if $SnO_2$ is used as the refining agent, the $SnO_2$ content is preferably 0.01-0.3%, more preferably 0.03-0.2%, and even more preferably 0.05-0.15%.

($Fe_2O_3$)

$Fe_2O_3$ is a component which works as a refining agent, and in addition, decreases the viscosity in a high-temperature region of a glass melt, and decreases the specific resistance. $Fe_2O_3$ is not an essential component, but is preferably comprised in a glass which has a high melting temperature and is therefore difficult to melt in order to decrease the melting temperature and specific resistance. If the amount of $Fe_2O_3$ is excessively large, color may be added to the glass, so that the transmittance may decrease. Therefore, in the glass substrate of this embodiment, the $Fe_2O_3$ content is preferably 0-0.1%, more preferably 0-0.08%, even more preferably 0.001-0.05%, and still even more preferably 0.005-0.03%. Here, in a glass having a high melting temperature, the temperature of the melting step is high, the effect of $Fe_2O_3$ as a refining agent is likely to decrease. Therefore, if $Fe_2O_3$ is used singly as a refining agent, the clarity may decrease, so that the foam quality of the glass substrate may deteriorate. Therefore, $Fe_2O_3$ is preferably used in combination with $SnO_2$.

(Components Not Comprised)

$As_2O_3$ and $Sb_2O_3$ are components that may result in a load on the environment. Therefore, the glass included in the glass substrate of this embodiment comprises substantially no $As_2O_3$ and $Sb_2O_3$.

(Components Preferably Not Comprised)

In view of the environmental load problem, the glass substrate of this embodiment comprises substantially no $As_2O_3$, $Sb_2O_3$, PbO, or F.

Also, compound parameters of components comprised in the glass substrate of this embodiment will be described hereinafter.

(($SiO_2+2Al_2O_3$)/($2B_2O_3+RO$))

When RO represents $MgO+CaO+SrO+BaO$, ($SiO_2+2Al_2O_3$)/($2B_2O_3+RO$) is preferably 2.5 or more, more preferably 2.8 or more, and even more preferably 3.0 or more. If ($SiO_2+2Al_2O_3$)/($2B_2O_3+RO$) is within such a range, both the improvement of the meltability and the increase of the Tg and strain point can simultaneously be obtained. Alternatively, both the improvement of the devitrification resistance and the increase of the Tg and strain point can simultaneously be obtained. Therefore, the glass included in the substrate of this embodiment is likely to simultaneously achieve high Tg and strain point, and good meltability or good devitrification resistance.

In order to reliably obtain the advantages, ($SiO_2+2Al_2O_3$)/($2B_2O_3+RO$) is preferably 3.1-4.3, and more preferably 3.3-3.65. Moreover, in order to prevent the increase of the devitrification temperature and achieve a sufficient etching rate, ($SiO_2+2Al_2O_3$)/($2B_2O_3+RO$) is preferably 2.5-10, more preferably 2.5-5, even more preferably 2.8-5, still even more preferably more than 3 to 4, and still even more preferably 3.1-3.5.

(Alkaline-Earth Metal Oxides (RO: $MgO+CaO+SrO+BaO$))

RO is a component which improves the meltability. If the amount of RO is excessively small, the meltability may deteriorate. However, if the amount of RO is excessively large, the Tg and strain point may decrease, the density may increase, the Young's modulus may decrease, and the coefficient of thermal expansion may increase. Therefore, in the glass included in the glass substrate of this embodiment, the RO content is preferably 3-25%, more preferably 4-20%. Note that when the glass substrate comprises only less than 3% SrO+BaO in order to further reduce the weight, the RO content is more preferably no less than 5% and less than 14%, even more preferably 6-14%, still even more preferably 8-13%, and still even more preferably 9-12%. On the other hand, when the glass substrate comprises 3% or more SrO+BaO, the RO content is more preferably no less than 5% and less than 18%, even more preferably 8-17%.

(CaO/RO)

When the glass comprises only less than 3% SrO+BaO in order to further reduce the weight, CaO/RO is preferably 0.5 or more, more preferably 0.7 or more, even more preferably more than 0.85, still even more preferably 0.88 or more, still even more preferably 0.90 or more, still even more preferably 0.92 or more, and still even more preferably 0.95 or more. In other words, CaO/RO is preferably 0.5-1, more preferably 0.7-1, even more preferably more than 0.85 to 1, still even more preferably 0.88-1, still even more preferably 0.90-1, still even more preferably 0.92-1, and still even more preferably 0.95-1. If CaO/RO is within such a range, good devitrification resistance and meltability can be simultaneously obtained. Moreover, the density can be reduced. If only CaO is comprised as a material, the Tg and strain point can be further increased than when a plurality of alkaline-earth metal oxides are comprised. Note that even if only CaO, which is an alkaline-earth metal oxide, is comprised as a material, the obtained glass may comprise another alkaline-earth metal oxide as an impurity. If only CaO, which is an alkaline-earth metal oxide, is comprised as a material, the value of CaO/RO of the obtained glass is, for example, about 0.98-1. CaO is also a preferable component because a material for CaO is inexpensive and easily available.

($SiO_2$—($Al_2O_3/2$))

If the value of $SiO_2$—($Al_2O_3/2$) is excessively small, the etching rate may increase, but the devitrification resistance may decrease. On the other hand, if the value is excessively large, the etching rate may decrease. Therefore, in the glass included in the glass of this embodiment, $SiO_2$—($Al_2O_3/2$) is preferably 69 or less, more preferably 60-68, and even more preferably 63-67. Note that if the glass substrate undergoes slimming during production of a display, then it is necessary to further increase the etching rate in order to improve the productivity. In this case, in order to further improve the productivity $SiO_2$—($Al_2O_3/2$) is preferably 69 or less, more preferably 50-68, even more preferably 55-65, still even more preferably 57-63, and still even more preferably 58-62.

In order to perform etching (slimming) the glass substrate with a high productivity, the etching rate is preferably 50 μm/h or more. On the other hand, if the etching rate is excessively high, a problem is likely to occur in a reaction with a chemical solution in a panel production step. Therefore, for the glass included in the glass substrate, the etching rate is preferably 160 μm/h or less. The etching rate is preferably 60-140 μm/h, more preferably 70-120 μm/h. In the present invention, the etching rate is defined as being measured under the following conditions.

The etching rate (μm/h) is represented by the amount of a decrease in the thickness of one surface of the glass substrate per unit time (one hour), where the glass substrate is immersed in an etchant (an acid mixture of HF (concentration: 1 mol/kg) and HCl (concentration: 5 mol/kg)) at 40° C. for 1 hour.

($SiO_2+2Al_2O_3$)

If $SiO_2+2Al_2O_3$ is excessively small, the Tg and strain point are likely to decrease. On the other hand, if $SiO_2+2Al_2O_3$ is excessively large, the devitrification resistance is likely to deteriorate. Therefore, in the glass included in the glass substrate of this embodiment, $SiO_2+2Al_2O_3$ is preferably 80% or more, more preferably 80-100%, even more preferably 85-98%, still even more preferably 89-97%, and still even more preferably 90-96%. Note that when the glass comprises only less than 3% SrO+BaO in order to further reduce the weight, $SiO_2+2Al_2O_3$ is more preferably 91-95%, and even more preferably 91-93.5%. On the other hand, when the glass comprises 3% or more SrO+BaO, $SiO_2+2Al_2O_3$ is more preferably 91-96%.

($Al_2O_3/SiO_2$)

If $Al_2O_3/SiO_2$ exceeds 0.35, the devitrification resistance is likely to deteriorate. On the other hand, if $Al_2O_3SiO_2$ is 0.05 or less, the Tg and strain point cannot be sufficiently increased. Therefore, in this embodiment, $Al_2O_3/SiO_2$ is 0.05-0.35, preferably 0.07-0.30, and more preferably 0.10-0.25.

($B_2O_3+P_2O_5$)

If $B_2O_3+P_2O_5$ is excessively small, the meltability is likely to decrease. On the other hand, if $B_2O_3+P_2O_5$ is excessively large, $B_2O_3+P_2O_5$ evaporates during melting of the glass, so that the non-uniformity of the glass becomes significant, and therefore, a cord is likely to occur. Moreover, the Tg and strain point are likely to decrease. Therefore, in the glass included in the glass substrate of this embodiment, $B_2O_3+P_2O_5$ is preferably 3-15%, more preferably 3-10%. Note that when the glass comprises only less than 3% SrO+BaO in order to further reduce the weight, $B_2O_3+P_2O_5$ is more preferably no less than 3% and less than 9.5%, even more preferably no less than 4% and less than 8.9%, still even more preferably 5-8.5%, and still even more preferably 6-8%. Moreover, in order to improve the devitrification resistance, $B_2O_3+P_2O_5$ is more preferably 5-13%, even more preferably 5-12%, still even more preferably 6% to less than 10% (no less than 6% and less than 10%). On the other hand, when the glass comprises 3% or more SrO+BaO, $B_2O_3+P_2O_5$ is more preferably 3-9%, even more preferably 4-8%.

($CaO/B_2O_3$)

Note that when the glass comprises only less than 3% SrO+BaO in order to further reduce the weight, then if $CaO/B_2O_3$ is excessively low, the Tg and strain point are likely to decrease. On the other hand, if $CaO/B_2O_3$ is excessively high, the meltability is likely to deteriorate. Therefore, in this embodiment, $CaO/B_2O_3$ is preferably 0.5 or more, more preferably 0.7 or more, even more preferably 0.9 or more, still even more preferably more than 1.2, still even more preferably more than 1.2 and no more than 5, still even more preferably more than 1.2 and no more than 3, still even more preferably 1.3 or more and 2.5 or less, and still even more preferably 1.3 or more and 2 or less. Moreover, in order to improve the meltability, $CaO/B_2O_3$ is preferably 0.5-5, more preferably 0.9-3, even more preferably more than 1 and no more than 2.5, still even more preferably more than 1 and no more than 2, still even more preferably more than 1.2 and no more than 2, and still even more preferably more than 1.2 and no more than 1.5.

(SrO+BaO)

SrO and BaO are components which can decrease the devitrification temperature of a glass. These components are not essential, but if these components are comprised, the devitrification resistance and meltability can be improved. However, if the amount of these components is excessively large, the density increases. Therefore, it is difficult to decrease the density and reduce the weight. Also, the coefficient of thermal expansion may increase. Therefore, in the glass included in the glass substrate of this embodiment, SrO+BaO is preferably 10% or less. Note that, in order to further reduce the weight, SrO+BaO is more preferably 5% or less, even more preferably less than 3%, and still even more preferably less than 2%. Still even more preferably, the glass included in the glass substrate of this embodiment comprises substantially no SrO or BaO. In other words, SrO+BaO is preferably 0-10%. In order to further reduce the weight, SrO+BaO is more preferably 0-5%, even more preferably 0% to less than 3% (no less than 0% and less than 3%), still even more preferably 0% to less than 2% (no less than 0% and less than 2%), still even more preferably 0% to less than 1% (no less than 0% and less than 1%), and still even more preferably 0% to less than 0.5% (no less than 0% and less than 0.5%). Still even more preferably, the glass included in the glass substrate of this embodiment comprises no SrO or BaO.

($RO+ZnO+B_2O_3$)

If $RO+ZnO+B_2O_3$ is excessively small, the viscosity in a high-temperature region is likely to be high, and the clarity and glass meltability are likely to decrease. On the other hand, if $RO+ZnO+B_2O_3$ is excessively large, the Tg and strain point are likely to decrease. Therefore, in the glass included in the glass substrate of this embodiment, $RO+ZnO+B_2O_3$ is preferably 7-30%, more preferably 10-27%. Note that when the glass comprises only less than 3% SrO+BaO in order to further reduce the weight, $RO+ZnO+B_2O_3$ is more preferably 12-22%, even more preferably 14-21%, and still even more preferably 16-20%. Moreover, in order to improve the meltability, $RO+ZnO+B_2O_3$ is more preferably 12-27%, even more preferably 14-25%, and still even more preferably 17-23%. On the other hand, when the glass comprises 3% or more SrO+BaO, $RO+ZnO+B_2O_3$ is more preferably 13-27%, even more preferably 15-25%.

(Alkali Metal Oxide ($R_2O$: $Li_2O+Na_2O+K_2O$))

$R_2O$ is a component which increases the basicity of a glass to facilitate oxidation of a refining agent, thereby imparting clarity to the glass. $R_2O$ is also a component which facilitates improvement of the meltability of a glass and decrease of the specific resistance of the glass, and may be comprised. $R_2O$ is not an essential component, but if it is comprised, can decrease the specific resistance and improve the clarity and meltability. However, if the amount of $R_2O$ is excessively large, the Tg and strain point may excessively decrease, and the coefficient of thermal expansion may increase. Therefore, in the glass included in the glass substrate of this embodiment, $R_2O$ is preferably 0-0.8%, more preferably 0.01-0.5%, and even more preferably 0.1-0.3%.

($K_2O/R_2O$)

$K_2O$ has a larger molecular weight than those of $Li_2O$ and $Na_2O$, and therefore, elutes from the glass substrate to a lesser extent. Therefore, if $R_2O$ is comprised, $K_2O$ is preferably comprised at a higher ratio. $K_2O$ is preferably comprised at a higher ratio than that of $Li_2O$ ($K_2O>Li_2O$ is satisfied). $K_2O$ is preferably comprised at a higher ratio than that of $Na_2O$ ($K_2O>Na_2O$ is satisfied). $K_2O/R_2O$ is preferably 0.5 or more, more preferably 0.6 or more, even more preferably 0.7 or more, still even more preferably 0.8 or more, and still even more preferably 0.95 or more. In other words, $K_2O/R_2O$ is preferably 0.5-1, more preferably 0.6-1, even more preferably 0.7-1, still even more preferably 0.8-1, and still even more preferably 0.95-1.

The glass included in the glass substrate of this embodiment can be obtained by appropriately combining the above components. The combination of the composition is not limited. Example combinations will be described hereinafter. The glass may comprise 62-74% $SiO_2$
3-20% $Al_2O_3$
3-15% $B_2O_3$
more than 7% to 16% CaO
0-1% $La_2O_3$
0% to less than 1% (no less than 0% and less than 1%) BaO,
wherein
  the strain point of the glass is 665% or more, and
  the $B_2O_3$, $P_2O_5$, and CaO contents in mol % may satisfy relationships $B_2O_3+P_2O_5=3$-15% and $CaO/B_2O_3>1.2$.
  Alternatively, the glass may comprise
  65-74% $SiO_2$
  3-20% $Al_2O_3$
  3% to less than 8.9% (no less than 3% and less than 8.9%) $B_2O_3$
  more than 7% to 16% CaO
  0-1% $La_2O_3$,
  substantially no BaO,
wherein
  the $B_2O_3$, $P_2O_5$, and CaO contents in mol % may satisfy relationships $B_2O_3+P_2O_5=3$-9.5% and $CaO/B_2O_3>1.2$.

The glass substrate of this embodiment is a substrate for displays. Specifically, the glass substrate of this embodiment is suitable as a flat panel display glass substrate on which the p-Si TFT is formed. The glass substrate of this embodiment is also suitable as a liquid crystal display glass substrate and an organic EL display glass substrate. In particular, the glass substrate of this embodiment is suitable as a p-Si TFT liquid crystal display glass substrate and organic EL display glass substrate. The glass substrate of this embodiment is suitable as a display glass substrate for mobile terminals for which a high resolution is required, among other things. Alternatively, the glass substrate of this embodiment is suitable as an oxide semiconductor thin film flat panel display glass substrate. More specifically, the glass substrate of this embodiment is suitable as a glass substrate used in a flat panel display which is produced by forming an oxide semiconductor thin film TFT on a substrate surface.

The size of the glass substrate of this embodiment can be appropriately adjusted, depending on the size of a display to which the glass substrate is applied, and therefore, is not particularly limited. The length in the width direction of the glass substrate is, for example, 500-3500 mm, preferably 1000-3500 mm, and more preferably 2000-3500 mm. The length in the longitudinal direction of the glass substrate, for example, 500-3500 mm, preferably 1000-3500 mm, and more preferably 2000-3500 mm. As the size of the glass substrate increases, the productivity of liquid crystal displays or organic EL displays is improved.

The thickness of the glass substrate of this embodiment can be appropriately adjusted, depending on the size of a display to which the glass substrate is applied, and therefore, is not particularly limited. However, if the glass substrate is excessively thin, the strength of the glass substrate itself decreases. For example, damage is likely to occur during production of a liquid crystal display. On the other hand, if the glass substrate is excessively thick, the glass substrate is not suitable for a display which is desired to be thinner. Also, if the glass substrate is excessively thick, the glass substrate has a heavy weight, and therefore, it is difficult to reduce the weight of a liquid crystal display. Therefore, the thickness of the glass substrate of this embodiment is preferably 0.1-1.1 mm, more preferably 0.1-0.7 mm, even more preferably 0.3-0.7 mm, and still even more preferably 0.3-0.5 mm.

The glass substrate of this embodiment is manufactured by a method including a melting step of melting a glass material to produce molten glass, a forming step of forming the molten glass into a glass plate, and an annealing step of annealing the glass plate. Note that the heat shrinkage rate of the glass plate is 75 ppm or less, preferably 60 ppm or less. The glass included in the glass substrate has a devitrification temperature of 1250° C. or less, and comprises, as expressed in mol %, $SiO_2$ (55-80%), $Al_2O_3$ (3-20%), $B_2O_3$ (3-15%), and RO (3-25%: the total amount of MgO, CaO, SrO, and BaO) as a glass composition. The glass substrate of this embodiment comprises substantially no $Al_2O_3$ and $Sb_2O_3$ in the glass composition.

The glass substrate of this embodiment can be manufactured by a known method for manufacturing a glass substrate. Also, a known forming method can be used, and a float process or a downdraw process is preferable. In particular, the overflow downdraw process is preferable. The glass substrate formed by the downdraw process has main surfaces which are made by hot forming, and therefore, is considerably highly flat and smooth. Therefore, it is no longer necessary to polish the surface of the glass substrate after the forming, resulting in a reduction in manufacturing cost and an improvement in productivity. Moreover, both main surfaces of the glass substrate formed by the downdraw process have a uniform composition, and therefore, can be uniformly etched during an etching process. In addition, by forming by the downdraw process, the glass substrate can obtain a surface condition free from a microcrack. As a result, the strength of the glass substrate itself can be improved.

In order to manufacture the glass substrate having a heat shrinkage ratio of 75 ppm or less, preferably 60 ppm or less, it is desirable that conditions under which annealing is performed be adjusted as appropriate. For example, when the downdraw process is used, annealing is desirably performed while keeping the temperature of the glass plate within the temperature range of Tg° C. to Tg-100° C. for 20-120 sec. In other words, when the downdraw process is used, annealing is desirably performed so that the glass plate is cooled to the temperature range of Tg° C. to Tg−100° C. in 20-120 sec. If the time is less than 20 sec, the amount of heat shrinkage may not be sufficiently reduced. On the other hand, if the time exceeds 120 sec, the productivity decreases and the size of the glass manufacturing equipment (annealing furnace) increases. Therefore, in order to reduce the heat shrinkage rate while keeping the cost and productivity, annealing is preferably performed while keeping the temperature of the glass plate within the temperature range of Tg° C. to Tg−100° C. for 20-120 sec, more preferably 30-120 sec, and even more preferably 50-100 sec. In other words, annealing is preferably performed so that the glass plate is cooled in the temperature range of Tg° C. to Tg−100° C. in 20-120 sec, more preferably 30-120 sec, and even more preferably 50-100 sec. Alternatively, annealing is preferably performed so that the average rate of cooling a center portion of the glass plate within the temperature range of Tg° C. to Tg−100° C. is 50-300° C./min. If the average cooling rate exceeds 300° C./min, the amount of heat shrinkage may not be sufficiently reduced. On the other hand, if the average cooling rate is less than 50° C./min, the productivity decreases and the size of the glass manufacturing equipment (annealing furnace) increases. Therefore, the average cooling rate range for reducing the heat shrinkage rate while keeping the cost and productivity is preferably 50-300° C./min, more preferably 50-200° C./min, and even more preferably 60-120° C./min. On the other hand, by separately providing a heat shrinkage reduction treatment (off-line annealing) step after the annealing step, the heat shrinkage rate can be reduced. However, if the off-line annealing step is provided separately from the annealing step, the productivity decreases and the cost increases. Therefore, as described above, the heat shrinkage reduction treatment (off-line annealing) of controlling the rate of cooling the glass plate is more preferably performed in the annealing step so that the heat shrinkage rate falls within the predetermined range.

The water content of glass may be represented by a β-OH value. As the β-OH value decreases, the Tg and strain point tend to increase. On the other hand, as the β-OH value increases, the melting temperature tends to decrease. In order to simultaneously achieve both the increase of the Tg and strain point and the improvement of the meltability, the β-OH value is preferably 0.05-0.40 mm$^{-1}$, more preferably 0.10-0.35 mm$^{-1}$, even more preferably 0.10-0.30 mm$^{-1}$, and still even more preferably 0.10-0.25 mm$^{-1}$. The β-OH value can be adjusted by selecting the material. For example, the β-OH value can be increased and decreased by selecting a material having a high water content (e.g., a hydroxide material) or adjusting the content of a material (e.g., a chloride) which reduces the water content of a glass. The β-OH value can also be adjusted by adjusting the ratio of gas heating burning (oxygen burning heating) and electrical heating (direct electrical heating) for melting glass. The β-OH value can also be increased by increasing the amount of moisture in furnace atmosphere or bubbling water vapor with respect to molten glass during the melting. Note that the β-OH value of a glass is calculated based on the infrared absorption spectrum of the glass by the following expression:

$$\beta\text{-OH value} = (1/X)\log 10(T_1/T_2)$$

X: glass thickness (mm)
T1: transmittance (%) at a reference wavelength of 2600 nm
T2: minimum transmittance (%) in the vicinity of a hydroxyl group absorption wavelength of 2800 nm As examples of the flat panel display glass substrate of this embodiment obtained from the present disclosure, first to third glass substrates will be described hereinafter. As examples of the method for manufacturing the glass substrate of this embodiment obtained from the present disclosure, first to third manufacturing methods will be described hereinafter.

The first flat panel display glass substrate includes a glass comprising, as expressed in mol %:
55-80% $SiO_2$;
3-20% $Al_2O_3$;
3-15% $B_2O_3$;
3-25% RO (the total amount of MgO, CaO, SrO, and BaO); and substantially no $As_2O_3$ and $Sb_2O_3$,
wherein
the devitrification temperature of the glass is 1250° C. or less, and
the heat shrinkage rate of the glass substrate is 75 ppm or less.

Examples of the first flat panel display glass substrate include a glass substrate whose heat shrinkage rate is 60 ppm or less. That is, the glass substrate includes a glass comprising, as expressed in mol %:
55-80% $SiO_2$;
3-20% $Al_2O_3$;
3-15% $B_2O_3$;
RO (the total amount of MgO, CaO, SrO, and BaO) 3-25%; and
substantially no $As_2O_3$ and $Sb_2O_3$,
wherein
the devitrification temperature of the glass is 1250° C. or less, and
the heat shrinkage rate of the glass substrate is 60 ppm or less.

The second flat panel display glass substrate include a glass comprising, as expressed in mol %,
62-74% $SiO_2$
3-20% $Al_2O_3$
3-15% $B_2O_3$
more than 7% to 16% CaO
0-1% $La_2O_3$,
0% to less than 1% BaO,
wherein
the $B_2O_3$, $P_2O_5$, and CaO contents in mol % may satisfy relationships $B_2O_3+P_2O_5=3$-15% and $CaO/B_2O_3>1.2$.
the strain point of the glass is 665° C. or more, and
the devitrification temperature of the glass is 1250° C. or less.

The third flat panel display glass substrate includes a glass comprising, as expressed in mol %,
65-74% $SiO_2$
3-20% $Al_2O_3$
3% to less than 8.9% $B_2O_3$
3.6-16% CaO
more than 7% to 16% CaO
0-1% $La_2O_3$,
substantially no BaO,
wherein
the contents in mol % of $B_2O_3$, $P_2O_5$, and CaO satisfy relationships $B_2O_3+P_2O_5=3$-9.5% and $CaO/B_2O_3>1.2$, and
the devitrification temperature of the glass is 1250° C. or less.

The first to third flat panel display glass substrates are suitable as flat panel display glass substrates on which the p-Si TFT is formed. In particular, the first to third flat panel display glass substrates are suitable as liquid crystal display glass substrates on which the p-Si TFT is formed. Alternatively, the first to third flat panel display glass substrates are also suitable as organic EL display glass substrates. Alternatively, the first to third flat panel display glass substrates are suitable as display glass substrates on which an oxide semiconductor thin film transistor is formed.

The first method for manufacturing a flat panel display glass substrate includes:

a melting step of melting a glass material for a glass comprising, as expressed in mol %, 55-80% $SiO_2$, 3-20% $Al_2O_3$, 3-15% $B_2O_3$, 3-25% RO (the total amount of MgO, CaO, SrO, and BaO), and substantially no $As_2O_3$ and $Sb_2O_3$, and the devitrification temperature of the glass being 1250° C. or less, to produce a molten glass;

a forming step of forming the molten glass into a glass plate; and an annealing step of annealing the glass plate, wherein the heat shrinkage rate of the glass plate is 75 ppm or less.

Examples of the first manufacturing method include a manufacturing method that includes:

a melting step of melting a glass material for a glass comprising, as expressed in mol %, 55-80% $SiO_2$, 3-20% $Al_2O_3$, 3-15% $B_2O_3$, 3-25% RO (the total amount of MgO, CaO, SrO, and BaO), and substantially no $As_2O_3$ and $Sb_2O_3$, and the devitrification temperature of the glass being 1250° C. or less, to produce a molten glass;

a forming step of forming the molten glass into a glass plate; and an annealing step of annealing the glass plate, wherein the heat shrinkage rate of the glass plate is 60 ppm or less.

The second method for manufacturing a flat panel display glass substrate includes:

a melting step of melting a glass material for a glass comprising, as expressed in mol %, 62-74% $SiO_2$, 3-20% $Al_2O_3$, 3-15% $B_2O_3$, more than 7% to 16% CaO, 0-1% $La_2O_3$, and 0% to less than 1% BaO, with the contents in mol % of $B_2O_3$, $P_2O_5$, and CaO satisfying relationships $B_2O_3+P_2O_5=3$-15% and $CaO/B_2O_3>1.2$, the strain point of the glass being 665° C. or more, and the devitrification temperature of the glass being 1250° C. or less, to produce a molten glass;

a forming step of forming the molten glass into a glass plate; and an annealing step of annealing the glass plate.

The third method for manufacturing a flat panel display glass substrate includes:

a melting step of melting a glass material for a glass comprising, as expressed in mol %, 65-74% $SiO_2$, 3-20% $Al_2O_3$, 3-8.9% $B_2O_3$, more than 7% to 16% CaO, 0-1% $La_2O_3$, and substantially no BaO, with the contents in mol % of $B_2O_3$, $P_2O_5$, and CaO satisfying relationships $B_2O_3+P_2O_5=3$-9.5% and $CaO/B_2O_3>1.2$ and the devitrification temperature of the glass being 1250° C. or less, to produce a molten glass;

a forming step of forming the molten glass into a glass plate; and an annealing step of annealing the glass plate.

In the annealing steps of the first to third manufacturing methods of the flat panel display glass substrate, a heat shrinkage reduction treatment for reducing the heat shrinkage rate is preferably performed by controlling the rate of cooling the glass plate. Also, in the annealing steps, the heat shrinkage reduction treatment is more preferably performed so that the average cooling rate of a center portion of the glass plate within the temperature range of Tg° C. to Tg−100° C. is 50-300° C./min.

EXAMPLES

Next, the glass substrate of the present invention will be described in detail by way of example. Note that the present invention is not intended to be limited to examples described below.

<First Glass Substrate>

The first glass substrate will be described by way of example. Note that the first glass substrate includes a glass comprising, as expressed in mol %:

55-80% $SiO_2$;
3-20% $Al_2O_3$;
3-15% $B_2O_3$;
3-25% RO (the total amount of MgO, CaO, SrO, and BaO); and
substantially no $As_2O_3$ and $Sb_2O_3$,
wherein
the devitrification temperature of the glass is 1250° C. or less, and
the heat shrinkage rate of the glass substrate is 75 ppm or less.

Examples 1-1 to 1-24 and Comparative Examples 1-1 to 1-6

Sample glasses of Examples 1-1 to 1-24 and Comparative Examples 1-1 to 1-6 were produced by a procedure described below so that the sample glasses have glass compositions shown in Tables 1-1 and 1-2. For the obtained sample glasses and sample glass substrates, devitrification temperature, Tg, average coefficient of thermal expansion within the range of 100-300° C., heat shrinkage rate, density, strain point, melting temperature (glass temperature where viscosity is $10^{2.5}$ dPa·s), liquidus viscosity, and specific resistance at 1550° C., were measured.

(Production of Sample Glass)

Initially, glass material batches (hereinafter referred to as "batches") having glass compositions shown in Tables 1 were prepared using typical glass materials, i.e., silica, alumina, boron oxide, potassium carbonate, basic magnesium carbonate, calcium carbonate, strontium carbonate, tin dioxide, and iron(III) oxide, in amounts which would provide 400 g of a glass.

The prepared batch was melted, followed by refining, in a platinum crucible.

Initially, the crucible was held for 4 hours in an electrical furnace which was set to 1575° C. to melt the batch. Next, the temperature of the electrical furnace was increased to 1640° C., and the platinum crucible was held for 2 hours to perform refining on the glass melt. Thereafter, the glass melt was poured onto an iron plate outside the furnace, and was cooled and solidified to obtain a glass piece. Following this, an annealing process was performed on the glass piece. In the annealing process, the glass piece was held for 2 hours in another electrical furnace which was set to 800° C., and thereafter, cooled for 2 hours until the temperature dropped to 740° C., and further cooled for 2 hours until the temperature dropped to 660° C. Thereafter, the electrical furnace was turned off, and the glass piece was cooled to room temperature. The glass piece after the annealing process was a sample glass. The sample glass was used to measure properties (devitrification temperature, melting temperature, specific resistance, density, coefficient of thermal expansion, and Tg and strain point), which are not affected by annealing conditions and/or cannot be measured in the form of a substrate.

The sample glass was cut, ground, and polished to produce a sample glass substrate of 30 mm×40 mm×0.7 mm whose top and bottom surfaces are a mirror surface. The sample glass substrate was used to measure β-OH, which is not affected by annealing conditions.

Moreover, the sample glass substrate was formed into a rectangular parallelepiped having a width of 5 mm and a length of 20 mm by a commonly used glass processing technique. The resulting sample glass substrate was kept at Tg for 30 min, and thereafter, cooled at a rate of 100° C./min until the temperature reached Tg-100° C. and then cooled until the temperature reached room temperature. The sample glass substrate for measurement of heat shrinkage was thus prepared.

(Method for Measuring Devitrification Temperature)

The sample glass was pulverized, and was passed through a 2380-μm sieve. Glass particles which were retained on a 1000-μm sieve were obtained. The glass particles were immersed in ethanol, followed by ultrasonic cleaning and then drying in a constant temperature bath. Twenty-five grams of the dried glass particles were placed to substantially a uniform thickness in a platinum boat having a width of 12 mm, a length of 200 mm, and a depth of 10 mm. The platinum boat was held for 5 hours in an electrical furnace having a temperature gradient of 1080-1320° C. (for Examples 1-1 to 1-6, 1-8 to 1-24 and Comparative Examples 1-1 and 1-3 to 1-5) or 1140-1380° C. (for Examples 1-7 and Comparative Examples 1-2 and 1-6). Thereafter, the platinum boat was removed from the furnace. Devitrification occurring inside the glass was observed by a 50× optical microscope. A highest temperature at which devitrification was observed was defined as a devitrification temperature.

(Melting Temperature)

The melting temperature of the sample glass was measured using a platinum sphere dragging type automatic viscometer. A temperature at which the viscosity was $10^{2.5}$ dPa·s was calculated from the measurement result, and was defined as the melting temperature.

(Liquidus Viscosity)

A viscosity at the devitrification temperature was calculated from the measurement result of the melting temperature, and was defined as a liquidus viscosity.

(Specific Resistance)

The specific resistance of the sample glass as it is melted was measured by four-terminal sensing using the 4192A LF impedance analyzer (manufactured by HP). The specific resistance value at 1550° C. was calculated from the measurement result.

(Method for Measuring Average Coefficient of Thermal Expansion and Tg within Range of 100-300° C.)

The sample glass was processed into the form of a cylinder having a diameter (ϕ) of 5 mm and a length of 20 mm, and was used as a test piece. The temperature and the amount of expansion/shrinkage of the test piece were measured in the process of rising the temperature of the test piece using a differential thermal dilatometer (Thermo Plus2 TMA8310). In this case, the rate of rising the temperature was 5° C./min. The average coefficient of thermal expansion and the Tg within the temperature range of 100-300° C. were measured based on the measurement results of the temperature and the amount of expansion/shrinkage of the test piece. Note that the Tg as used herein refers to a value of a sample glass which was measured by holding a glass piece in another electrical furnace which was set to 800° C. for 2 hours, cooling the glass piece for 2 hours until the temperature dropped to 740° C., and then cooling the glass piece for 2 hours until the temperature dropped to 660° C., and thereafter, turning off the electrical furnace, and cooling the glass piece until the temperature dropped to room temperature.

(Strain Point)

The sample glass was cut and ground into the form of a prism having a 3-mm square base and a length of 55 mm, and was used as a test piece. The test piece was measured using a beam bending measurement device (manufactured by TokyoKogyo Co., Ltd.). The strain point was calculated by a beam bending technique (ASTM C-598).

(Density)

The sample glass was mirror-polished to produce a plate-like sample of 5×30×30 mm. This sample was used to measure the density of the glass using Archimedes' technique.

(Heat Shrinkage Rate)

The heat shrinkage rate was calculated from the amount of shrinkage of the glass substrate for measurement of heat shrinkage after a heat treatment at 550° C. for 2 hours using the following expression:

the heat shrinkage rate (ppm)={the amount of shrinkage of the glass substrate after the heat treatment/the length of the glass substrate before the heat treatment}×$10^6$ In this example, the amount of shrinkage was specifically measured by the following technique.

The heat shrinkage sample glass was heated from room temperature to 550° C. using a differential thermal dilatometer (Thermoflex TMA8140 manufactured by Rigaku Corporation), was held for 2 hours, and was cooled to room temperature. The amount of shrinkage of the sample glass between before and after the heat treatment was measured. In this case, the rate of rising and falling the temperature was 10° C./min.

(Etching Rate)

The glass substrate was immersed in an etchant (an acid mixture of HF (concentration: 1 mol/kg) and HCl (concentration: 5 mol/kg)) at 40° C. for 1 hour, and a reduction (μm) in the thickness of one surface of the glass substrate was measured. The reduction (μm) per unit time (one hour) was defined as an etching rate (μm/h).

TABLE 1-1

| | | | | | | | | Examples | | | | | | | | |
|---|---|---|---|---|---|---|---|---|---|---|---|---|---|---|---|---|
| | | 1-1 | 1-2 | 1-3 | 1-4 | 1-5 | 1-6 | 1-7 | 1-8 | 1-9 | 1-10 | 1-11 | 1-12 | 1-13 | 1-14 | 1-15 |
| Composition (mol %) | $SiO_2$ | 71.7 | 71.6 | 70.8 | 70.5 | 70.5 | 70.3 | 69.4 | 69.7 | 67.2 | 66.7 | 69.7 | 67.5 | 67.3 | 67.8 | 66.9 |
| | $B_2O_3$ | 6.0 | 6.0 | 6.9 | 7.4 | 7.4 | 7.8 | 8.7 | 9.7 | 4.7 | 5.0 | 5.0 | 7.5 | 8.3 | 7.8 | 9.2 |
| | $Al_2O_3$ | 11.1 | 11.1 | 11.0 | 10.9 | 10.9 | 10.9 | 10.8 | 10.8 | 12.5 | 13.2 | 12.2 | 12.9 | 12.7 | 12.5 | 12.2 |
| | $K_2O$ | | 0.17 | 0.17 | 0.17 | 0.17 | | 0.40 | | 0.17 | 0.17 | 0.17 | 0.20 | 0.17 | 0.17 | 0.17 |
| | MgO | | | | | 1.0 | | | | | 7.4 | 5.8 | | | | |
| | CaO | 11.1 | 11.1 | 11.0 | 10.9 | 9.9 | 10.9 | 9.8 | 8.9 | 6.9 | 1.3 | 1.42 | 11.7 | 11.5 | 11.5 | 11.4 |
| | SrO | | | | | | | 0.8 | 0.8 | 1.7 | | | | | | |
| | BaO | | | | | | | | | 6.8 | 6.2 | 5.7 | | | | |
| | $SnO_2$ | 0.08 | 0.08 | 0.08 | 0.08 | 0.08 | 0.08 | 0.08 | 0.08 | 0.09 | 0.09 | 0.09 | 0.10 | 0.08 | 0.08 | 0.08 |
| | $Fe_2O_3$ | | 0.022 | 0.022 | 0.022 | 0.022 | | | | | | | 0.02 | 0.02 | 0.02 | 0.02 |
| | $(SiO_2 + 2Al_2O_3)/(2B_2O_3 + RO)$ | 4.06 | 4.06 | 3.74 | 3.60 | 3.60 | 3.46 | 3.25 | 3.14 | 3.71 | 3.73 | 4.10 | 3.49 | 3.30 | 3.42 | 3.07 |
| | $SiO_2 + 2Al_2O_3$ | 93.9 | 93.7 | 92.8 | 92.3 | 92.3 | 92.1 | 91.0 | 91.3 | 92.2 | 93.1 | 94.1 | 93.3 | 92.6 | 92.9 | 91.4 |
| | $RO + B_2O_3 + ZnO$ | 17.1 | 17.1 | 17.9 | 18.3 | 18.3 | 18.7 | 19.3 | 19.4 | 20.1 | 19.9 | 17.9 | 19.2 | 19.8 | 19.4 | 20.5 |
| | $Al_2O_3/SiO_2$ | 0.15 | 0.15 | 0.15 | 0.15 | 0.15 | 0.15 | 0.15 | 0.15 | 0.19 | 0.20 | 0.18 | 0.19 | 0.19 | 0.18 | 0.18 |
| | RO | 11.1 | 11.1 | 11.0 | 10.9 | 10.9 | 10.9 | 10.6 | 9.7 | 15.4 | 14.9 | 12.9 | 11.7 | 11.5 | 11.5 | 11.4 |
| | $B_2O_3 + P_2O_5$ | 6.0 | 6.0 | 6.9 | 7.4 | 7.4 | 7.8 | 8.7 | 9.7 | 4.7 | 5.0 | 5.0 | 7.5 | 8.3 | 7.8 | 9.2 |
| | CaO/RO | 1 | 1 | 1 | 1 | 0.91 | 1 | 0.93 | 0.92 | 0.11 | 0.09 | 0.11 | 1 | 1 | 1 | 1 |
| | $SiO_2 - Al_2O_3/2$ | 66.1 | 66.0 | 65.4 | 65.0 | 65.0 | 64.8 | 64.1 | 64.3 | 61.0 | 60.1 | 63.6 | 61.1 | 61.0 | 61.6 | 60.8 |
| | β-OH | 0.11 | 0.12 | 0.11 | 0.11 | 0.12 | 0.13 | 0.13 | 0.11 | 0.13 | 0.13 | 0.14 | 0.12 | 0.11 | 0.11 | 0.10 |
| Properties | devitrification temperature (° C.) | 1233 | 1230 | 1213 | 1189 | 1206 | 1187 | <1140 | 1151 | 1241 | 1219 | 1215 | 1230 | 1220 | 1236 | 1193 |
| | Tg (° C.) | 782 | 776 | 766 | 758 | 751 | 761 | 741 | 745 | 749 | 764 | 768 | 763 | 754 | 760 | 741 |
| | average coefficient of thermal expansion (×$10^{-7}$) (100-300° C.) | 34.2 | 34.0 | 32.9 | 32.6 | 33.1 | 33.2 | 36.3 | 29.6 | 39.8 | 36.4 | 33.6 | 36.0 | 35.9 | 36.0 | 36.1 |
| | a heat shrinkage rate (ppm) | 31 | 36 | 44 | 48 | 52 | 46 | 40 | 32 | 42 | 29 | 27 | 28 | 33 | 31 | 40 |
| | density (g/$cm^3$) | 2.41 | 2.41 | 2.40 | 2.39 | 2.39 | 2.38 | 2.40 | 2.37 | 2.58 | 2.55 | 2.52 | 2.40 | 2.41 | 2.42 | 2.40 |
| | strain point (° C.) | 723 | 716 | 707 | 709 | 704 | 707 | 685 | 695 | 694 | 712 | 711 | 712 | 702 | 710 | 695 |
| | melting temperature (° C.) | 1644 | 1632 | 1620 | 1608 | 1609 | 1610 | 1644 | 1650 | 1532 | 1538 | 1553 | 1587 | 1582 | 1579 | 1567 |
| | liquidus viscosity (log η) | 5.0 | 5.0 | 5.1 | 5.2 | 5.0 | 5.2 | 5.3 | 5.5 | 4.3 | 4.5 | 4.7 | 4.6 | 4.7 | 4.6 | 4.9 |
| | specific resistance (Ω · cm) (1550° C.) | 243 | 193 | 194 | 195 | 194 | 248 | 170 | 253 | 203 | 203 | 236 | 137 | 133 | 129 | 142 |
| | etching rate (μm/h) | 65 | 65 | 67 | 69 | 69 | 69 | 72 | 71 | 83 | 85 | 73 | 80 | 82 | 80 | 83 |

TABLE 1-2

|  |  | Examples | | | | | | | | | Comparative Examples | | | | | |
|---|---|---|---|---|---|---|---|---|---|---|---|---|---|---|---|---|
|  |  | 1-16 | 1-17 | 1-18 | 1-19 | 1-20 | 1-21 | 1-22 | 1-23 | 1-24 | 1-1 | 1-2 | 1-3 | 1-4 | 1-5 | 1-6 |
| Composition (mol %) | $SiO_2$ | 67.64 | 72.0 | 66.5 | 66.5 | 66.5 | 63.5 | 70.5 | 70.5 | 70.5 | 71.7 | 71.7 | 66.4 | 67.64 | 67.64 | 67.64 |
|  | $B_2O_3$ | 7.83 | 6.4 | 9.5 | 9.5 | 4.5 | 4.5 | 7.4 | 7.4 | 7.4 | 4.0 |  | 11.0 | 7.83 | 7.83 | 7.83 |
|  | $Al_2O_3$ | 12.73 | 11.4 | 11.4 | 12.4 | 10.4 | 10.4 | 10.9 | 10.9 | 10.9 | 11.1 | 11.1 | 10.9 | 12.73 | 12.73 | 12.73 |
|  | $K_2O$ | 0.17 | 0.17 | 0.17 | 0.17 | 0.17 | 0.17 | 0.17 | 0.17 | 0.17 |  |  | 0.18 | 0.17 | 0.17 | 0.17 |
|  | MgO |  |  |  |  |  |  |  |  |  |  |  | 2.8 | 1 | 3 |  |
|  | CaO | 6.5 | 9.9 | 12.3 | 11.3 | 18.3 | 21.3 | 2.0 | 9.9 | 8.9 | 13.1 | 17.1 | 6.8 | 10.5 | 8.5 | 5 |
|  | SrO | 5 |  |  |  |  |  | 8.9 | 1.0 | 2.0 |  |  | 1.69 |  |  | 6.5 |
|  | BaO |  |  |  |  |  |  |  |  |  |  |  |  |  |  |  |
|  | $SnO_2$ | 0.08 | 0.08 | 0.08 | 0.08 | 0.08 | 0.08 | 0.08 | 0.08 | 0.08 | 0.08 | 0.09 | 0.09 | 0.08 | 0.08 | 0.08 |
|  | $Fe_2O_3$ | 0.022 | 0.022 | 0.022 | 0.022 | 0.022 | 0.022 | 0.022 | 0.022 | 0.022 |  |  | 0.03 | 0.022 | 0.022 | 0.022 |
|  | $(SiO_2 + 2Al_2O_3)/(2B_2O_3 + RO)$ | 3.42 | 4.18 | 2.85 | 3.00 | 3.19 | 2.77 | 3.60 | 3.60 | 3.60 | 4.45 | 5.49 | 2.64 | 3.42 | 3.42 | 3.42 |
|  | $SiO_2 + 2Al_2O_3$ | 93.1 | 94.8 | 89.3 | 91.3 | 87.3 | 84.3 | 92.3 | 92.3 | 92.3 | 93.9 | 93.9 | 88.3 | 93.1 | 93.1 | 93.1 |
|  | $RO + B_2O_3 + ZnO$ | 19.4 | 16.3 | 21.8 | 20.8 | 22.8 | 25.8 | 18.3 | 18.3 | 18.3 | 17.1 | 17.1 | 22.3 | 19.4 | 19.4 | 19.4 |
|  | $Al_2O_3/SiO_2$ | 0.19 | 0.16 | 0.17 | 0.19 | 0.16 | 0.16 | 0.15 | 0.15 | 0.15 | 0.15 | 0.15 | 0.16 | 0.19 | 0.19 | 0.19 |
|  | RO | 11.5 | 9.9 | 12.3 | 11.3 | 18.3 | 21.3 | 10.9 | 10.9 | 10.9 | 13.1 | 17.1 | 11.3 | 11.5 | 11.5 | 11.5 |
|  | $B_2O_3 + P_2O_5$ | 7.83 | 6.4 | 9.5 | 9.5 | 4.5 | 4.5 | 7.4 | 7.4 | 7.4 | 4.0 |  | 11.0 | 7.83 | 7.83 | 7.83 |
|  | CaO/RO | 0.57 | 1 | 1 | 1 | 1.00 | 1.00 | 0.82 | 1 | 1 | 1 |  | 0.60 | 0.91 | 0.74 | 0.57 |
|  | $SiO_2 - Al_2O_3/2$ | 61.3 | 66.3 | 60.7 | 60.2 | 61.2 | 58.2 | 65.0 | 65.0 | 65.0 | 66.1 | 66.1 | 61.0 | 61.3 | 61.3 | 61.3 |
|  | β-OH | 0.12 | 0.12 | 0.11 | 0.11 | 0.10 | 0.10 | 0.12 | 0.12 | 0.12 | 0.13 | 0.11 | 0.11 | 0.11 | 0.11 | 0.12 |
| Properties | devitrification temperature (° C.) | 1221 | 1235 | 1196 | 1208 | 1228 | 1206 | 1201 | 1207 | 1200 | 1282 | 1330 | 1196 | 1260 | 1294 | 1324 |
|  | Tg (° C.) | 758 | 781 | 731 | 743 | 739 | 732 | 742 | 752 | 753 | 786 | 826 | 707 | 758 | 749 | 746 |
|  | average coefficient of thermal expansion (×10$^{-7}$) (100-300° C.) | 38.2 | 33.3 | 37.2 | 36 | 46.8 | 50.9 | 30.4 | 35.0 | 35.8 | 29.8 | 41.0 | 34.3 | 34.4 | 33.3 | 32.8 |
|  | a heat shrinkage rate (ppm) | 33 | 23 | 47 | 39 | 49 | 54 | 39 | 34 | 33 | 17 | 13 | 114 | 32 | 37 | 38 |
|  | density (g/cm$^3$) | 2.48 | 2.38 | 2.40 | 2.40 | 2.50 | 2.55 | 2.38 | 2.41 | 2.42 | 2.445 | 2.510 | 2.40 | 2.41 | 2.40 | 2.40 |
|  | strain point (° C.) | 703 | 731 | 681 | 693 | 689 | 682 | 695 | 702 | 703 | 725 | 774 | 660 | 708 | 697 | 691 |
|  | melting temperature (° C.) | 1595 | 1640 | 1554 | 1560 | 1548 | 1541 | 1614 | 1610 | 1608 | 1675 | 1701 | 1529 | 1585 | 1580 | 1577 |
|  | liquidus viscosity (log η) | 4.8 | 4.9 | 4.7 | 4.6 | 4.3 | 4.4 | 5.1 | 5.0 | 5.1 | 4.7 | 4.4 | 4.6 | 4.4 | 4.2 | 4.0 |
|  | specific resistance (W × cm) (1550° C.) | 138 | 207 | 179 | 191 | 108 | 73 | 193 | 196 | 197 | 230 | 188 | 165 | 132 | 130 | 128 |
|  | etching rate (mm/h) | 83 | 64 | 83 | 85 | 81 | 92 | 69 | 69 | 69 | 65 | 65 | 82 | 83 | 81 | 79 |

The heat shrinkage rate and devitrification temperature of the glass substrates of Examples 1-1 to 1-24 satisfied the conditions of the first glass substrate of the present invention. Therefore, the glass substrates of this embodiment have excellent properties and can be used in displays to which the p-Si TFT is applied. On the other hand, the ratios of heat shrinkage or devitrification temperatures of the glasses of Comparative Examples 1-1 to 1-6 did not satisfy the conditions of the first glass substrate of the present invention. The melting temperature of the glass of Comparative Example 2 exceeded 1680° C., i.e., good meltability was not obtained. Thus, the glass substrates of Comparative Examples 1-1 to 1-6 were not suitable for displays to which the p-Si TFT is applied.

Example 1-25

A glass material prepared to have a composition shown in Example 1-4 was melted at 1560-1640° C., followed by refining at 1620-1670° C. and then stirring at 1440-1530° C., using continuous melting equipment including a melting bath of fire bricks and a refining bath (adjustment bath) of a platinum alloy. Thereafter, the glass material was formed into a thin plate having a thickness of 0.7 mm by the overflow downdraw process, followed by cooling at an average rate of 100° C./min within the temperature range of Tg° C. to Tg−100° C., thereby obtaining a glass substrate for liquid crystal displays (or organic EL displays). Note that the aforementioned properties of the obtained glass substrate were measured. Note that for properties (density, strain point, expansion coefficient, and Tg) which cannot be measured in the form of a substrate, the glass substrate was melted again to produce a sample glass according to the aforementioned sample production process, and the properties of the sample glass were measured.

The glass substrate of Example 1-25 thus obtained had a melting temperature of 1610° C., a β-OH value of 0.20 mm$^{-1}$, a Tg of 754° C., a strain point of 697° C., and a heat shrinkage rate of 51 ppm, and the other properties thereof were similar to those of Example 1-4. Thus, the glass substrate of Example 1-25 had a Tg of 720° C. or more and a melting temperature of 1680° C. or less, i.e., a high Tg and strain point and good meltability. Moreover, the heat shrinkage rate and devitrification temperature satisfied the conditions of the first glass substrate of the present invention. Note that the glass substrate of Example 1-25 has a β-OH value which is greater than that of Example 1-4 by about 0.1 mm$^{-1}$, and therefore, has a Tg which is lower than that of Example 1-4 by 2-3° C., and the Tg is still sufficiently high. Therefore, the glass substrate of Example 1-25 has excellent properties and can be used in displays to which the p-Si TFT is applied.

Example 1-26

A glass substrate was produced using a glass material prepared to have a glass composition shown in Example 1-12 in a manner similar to that of Example 1-25, and the properties of the glass substrate were measured.

The glass substrate of Example 1-26 thus obtained had a melting temperature of 1585° C., a β-OH value of 0.21 mm$^{-1}$, a Tg of 761° C., a strain point of 710° C., and a heat shrinkage rate of 31 ppm, and the other properties thereof were similar to those of Example 1-12. Thus, the glass substrate of Example 1-26 had a Tg of 720° C. or more and a melting temperature of 1680° C. or less, i.e., a high Tg and strain point and good meltability. Moreover, the heat shrinkage rate and devitrification temperature satisfied the conditions of the first glass substrate of the present invention. Note that the glass substrate of Example 1-26 has a β-OH value which is greater than that of Example 1-12 by about 0.1 mm$^{-1}$, and therefore, has a Tg which is lower than that of Example 1-12 by 2-3° C., and the Tg is still sufficiently high. Therefore, the glass substrate of Example 1-26 has excellent properties and can be used in displays to which the p-Si TFT is applied.

<Second Glass Substrate>

The second glass substrate will be described by way of example. Note that the second glass substrate includes a glass comprising, as expressed in mol %, 62-74% $SiO_2$
3-20% $Al_2O_3$
3-15% $B_2O_3$
more than 7% to 16% CaO
0-1% $La_2O_3$
0% to less than 1% BaO
wherein
the $B_2O_3$, $P_2O_5$, and CaO contents in mol % may satisfy relationships $B_2O_3+P_2O_5=3-15\%$ and $CaO/B_2O_3>1.2$,
the strain point of the glass is 665° C. or more, and
the devitrification temperature of the glass is 1250° C. or less.

Examples and comparative examples of the sample glass having glass compositions shown in Table 2 were produced in a manner similar to that of the examples and comparative examples of the first glass substrate, and the properties thereof were measured.

TABLE 2

|  |  | Examples | | | | | | | | | | |
| --- | --- | --- | --- | --- | --- | --- | --- | --- | --- | --- | --- | --- |
|  |  | 2-1 | 2-2 | 2-3 | 2-4 | 2-5 | 2-6 | 2-7 | 2-8 | 2-9 | 2-10 | 2-11 |
| Composition (mol %) | $SiO_2$ | 71.7 | 71.6 | 70.8 | 70.5 | 70.5 | 70.3 | 67.5 | 67.3 | 67.8 | 72.0 | 66.5 |
|  | $B_2O_3$ | 6.0 | 6.0 | 6.9 | 7.4 | 7.4 | 7.8 | 7.5 | 8.3 | 7.8 | 6.4 | 9.5 |
|  | $Al_2O_3$ | 11.1 | 11.1 | 11.0 | 10.9 | 10.9 | 10.9 | 12.9 | 12.7 | 12.5 | 11.4 | 11.4 |
|  | $K_2O$ |  | 0.17 | 0.17 | 0.17 | 0.17 |  | 0.20 | 0.17 | 0.17 | 0.17 | 0.17 |
|  | MgO |  |  |  |  | 1.0 |  |  |  |  |  |  |
|  | CaO | 11.1 | 11.1 | 11.0 | 10.9 | 9.9 | 10.9 | 11.7 | 11.5 | 11.5 | 9.9 | 12.3 |
|  | SrO |  |  |  |  |  |  |  |  |  |  |  |
|  | BaO |  |  |  |  |  |  |  |  |  |  |  |
|  | $SnO_2$ | 0.08 | 0.08 | 0.08 | 0.08 | 0.08 | 0.08 | 0.10 | 0.08 | 0.08 | 0.08 | 0.08 |
|  | $Fe_2O_3$ |  | 0.022 | 0.022 | 0.022 | 0.022 |  | 0.02 | 0.02 | 0.02 | 0.022 | 0.022 |
|  | $(SiO_2 + 2Al_2O_3)/(2B_2O_3 + RO)$ | 4.06 | 4.06 | 3.74 | 3.60 | 3.60 | 3.46 | 3.49 | 3.30 | 3.42 | 4.18 | 2.85 |
|  | $SiO_2 + 2Al_2O_3$ | 93.9 | 93.7 | 92.8 | 92.3 | 92.3 | 92.1 | 93.3 | 92.6 | 92.9 | 94.8 | 89.3 |
|  | $RO + B_2O_3 + ZnO$ | 17.1 | 17.1 | 17.9 | 18.3 | 18.3 | 18.7 | 19.2 | 19.8 | 19.4 | 16.3 | 21.8 |

TABLE 2-continued

| | | | | | | | | | | | | |
|---|---|---|---|---|---|---|---|---|---|---|---|---|
| | $Al_2O_3/SiO_2$ | 0.15 | 0.15 | 0.15 | 0.15 | 0.15 | 0.15 | 0.19 | 0.19 | 0.18 | 0.16 | 0.17 |
| | RO | 11.1 | 11.1 | 11.0 | 10.9 | 10.9 | 10.9 | 11.7 | 11.5 | 11.5 | 9.9 | 12.3 |
| | $B_2O_3 + P_2O_5$ | 6.0 | 6.0 | 6.9 | 7.4 | 7.4 | 7.8 | 7.5 | 8.3 | 7.8 | 6.4 | 9.5 |
| | CaO/RO | 1 | 1 | 1 | 1 | 0.91 | 1 | 1 | 1 | 1 | 1 | 1 |
| | $SiO_2$—$Al_2O_3/2$ | 66.1 | 66.0 | 65.4 | 65.0 | 65.0 | 64.8 | 61.1 | 61.0 | 61.6 | 66.3 | 60.7 |
| | β-OH | 0.11 | 0.12 | 0.11 | 0.11 | 0.12 | 0.13 | 0.12 | 0.11 | 0.11 | 0.12 | 0.11 |
| Properties | devitrification temperature (° C.) | 1233 | 1230 | 1213 | 1189 | 1206 | 1187 | 1230 | 1220 | 1236 | 1235 | 1196 |
| | Tg (° C.) | 782 | 776 | 766 | 758 | 751 | 761 | 763 | 754 | 760 | 781 | 731 |
| | average coefficient of thermal expansion ($\times 10^{-7}$) (100-300° C.) | 34.2 | 34.0 | 32.9 | 32.6 | 33.1 | 33.2 | 36.0 | 35.9 | 36.0 | 33.3 | 37.2 |
| | a heat shrinkage rate (ppm) | 31 | 36 | 44 | 48 | 52 | 46 | 28 | 33 | 31 | 23 | 47 |
| | density (g/cm³) | 2.41 | 2.41 | 2.40 | 2.39 | 2.39 | 2.38 | 2.40 | 2.41 | 2.42 | 2.38 | 2.40 |
| | strain point (° C.) | 723 | 716 | 707 | 709 | 704 | 707 | 712 | 702 | 710 | 731 | 681 |
| | melting temperature (° C.) | 1644 | 1632 | 1620 | 1608 | 1609 | 1610 | 1587 | 1582 | 1579 | 1640 | 1554 |
| | liquidus viscosity (log η) | 5.0 | 5.0 | 5.1 | 5.2 | 5.0 | 5.2 | 4.6 | 4.7 | 4.6 | 4.9 | 4.7 |
| | specific resistance (Ω · cm) (1550° C.) | 243 | 193 | 194 | 195 | 194 | 248 | 137 | 133 | 129 | 207 | 179 |
| | etching rate (μm/h) | 65 | 65 | 67 | 69 | 69 | 69 | 80 | 82 | 80 | 64 | 83 |

| | | Examples | | | Comparative Examples | | | | | |
|---|---|---|---|---|---|---|---|---|---|---|
| | | 2-12 | 2-13 | 2-14 | 2-1 | 2-2 | 2-3 | 2-4 | 2-5 | 2-6 |
| Composition (mol %) | $SiO_2$ | 70.5 | 70.5 | 70.5 | 71.7 | 71.7 | 66.4 | 67.64 | 67.64 | 67.64 |
| | $B_2O_3$ | 7.4 | 7.4 | 7.4 | 4.0 | | 11.0 | 7.83 | 7.83 | 7.83 |
| | $Al_2O_3$ | 10.9 | 10.9 | 10.9 | 11.1 | 11.1 | 10.9 | 12.73 | 12.73 | 12.73 |
| | $K_2O$ | 0.17 | 0.17 | 0.17 | | | 0.18 | 0.17 | 0.17 | 0.17 |
| | MgO | 2.0 | | | | | 2.8 | 1 | 3 | 5 |
| | CaO | 8.9 | 9.9 | 8.9 | 13.1 | 17.1 | 6.8 | 10.5 | 8.5 | 6.5 |
| | SrO | | 1.0 | 2.0 | | | 1.69 | | | |
| | BaO | | | | | | | | | |
| | $SnO_2$ | 0.08 | 0.08 | 0.08 | 0.08 | 0.09 | 0.09 | 0.08 | 0.08 | 0.08 |
| | $Fe_2O_3$ | 0.022 | 0.022 | 0.022 | | | 0.03 | 0.022 | 0.022 | 0.022 |
| | $(SiO_2 + 2Al_2O_3)/(2B_2O_3 + RO)$ | 3.60 | 3.60 | 3.60 | 4.45 | 5.49 | 2.64 | 3.42 | 3.42 | 3.42 |
| | $SiO_2 + 2Al_2O_3$ | 92.3 | 92.3 | 92.3 | 93.9 | 93.9 | 88.3 | 93.1 | 93.1 | 93.1 |
| | $RO + B_2O_3 + ZnO$ | 18.3 | 18.3 | 18.3 | 17.1 | 17.1 | 22.3 | 19.4 | 19.4 | 19.4 |
| | $Al_2O_3/SiO_2$ | 0.15 | 0.15 | 0.15 | 0.15 | 0.15 | 0.16 | 0.19 | 0.19 | 0.19 |
| | RO | 10.9 | 10.9 | 10.9 | 13.1 | 17.1 | 11.3 | 11.5 | 11.5 | 11.5 |
| | $B_2O_3 + P_2O_5$ | 7.4 | 7.4 | 7.4 | 4.0 | | 11.0 | 7.83 | 7.83 | 7.83 |
| | CaO/RO | 0.82 | 1 | 1 | 1 | 1 | 0.60 | 0.91 | 0.74 | 0.57 |
| | $SiO_2$—$Al_2O_3/2$ | 65.0 | 65.0 | 65.0 | 66.1 | 66.1 | 61.0 | 61.3 | 61.3 | 61.3 |
| | β-OH | 0.12 | 0.12 | 0.12 | 0.13 | 0.11 | 0.11 | 0.11 | 0.11 | 0.12 |
| Properties | devitrification temperature (° C.) | 1201 | 1207 | 1200 | 1282 | 1330 | 1196 | 1260 | 1294 | 1324 |
| | Tg (° C.) | 742 | 752 | 753 | 786 | 826 | 707 | 758 | 749 | 746 |
| | average coefficient of thermal expansion ($\times 10^{-7}$) (100-300° C.) | 30.4 | 35.0 | 35.8 | 29.8 | 41.0 | 34.3 | 34.4 | 33.3 | 32.8 |
| | a heat shrinkage rate (ppm) | 39 | 34 | 33 | 17 | 13 | 114 | 32 | 37 | 38 |
| | density (g/cm³) | 2.38 | 2.41 | 2.42 | 2.445 | 2.510 | 2.40 | 2.41 | 2.40 | 2.40 |
| | strain point (° C.) | 695 | 702 | 703 | 725 | 774 | 660 | 708 | 697 | 691 |
| | melting temperature (° C.) | 1614 | 1610 | 1608 | 1675 | 1701 | 1529 | 1585 | 1580 | 1577 |
| | liquidus viscosity (log η) | 5.1 | 5.0 | 5.1 | 4.7 | 4.4 | 4.6 | 4.4 | 4.2 | 4.0 |
| | specific resistance (Ω · cm) (1550° C.) | 193 | 196 | 197 | 230 | 188 | 165 | 132 | 130 | 128 |
| | etching rate (μm/h) | 69 | 69 | 69 | 65 | 65 | 82 | 83 | 81 | 79 |

<Third Glass Substrate>

The third glass substrate will be described by way of example. Note that the third glass substrate includes a glass comprising, as expressed in mol %,
65-74% $SiO_2$
3-20% $Al_2O_3$
3% to less than 8.9% $B_2O_3$
more than 7% to 16% CaO
0-1% $La_2O_3$
substantially no BaO wherein
the contents in mol % of $B_2O_3$, $P_2O_5$, and CaO satisfy relationships $B_2O_3+P_2O_5=3-9.5\%$ and $CaO/B_2O_3>1.2$, and
the devitrification temperature of the glass is 1250° C. or less.

Examples and comparative examples of the sample glass having glass compositions shown in Table 3 were produced in a manner similar to that of the examples and comparative examples of the first glass substrate, and the properties thereof were measured.

TABLE 3

|  |  | Examples | | | | | | | | | |
|---|---|---|---|---|---|---|---|---|---|---|---|
|  |  | 3-1 | 3-2 | 3-3 | 3-4 | 3-5 | 3-6 | 3-7 | 3-8 | 3-9 | 3-10 |
| Composition (mol %) | $SiO_2$ | 71.7 | 71.6 | 70.8 | 70.5 | 70.5 | 70.3 | 67.5 | 67.3 | 67.8 | 72.0 |
|  | $B_2O_3$ | 6.0 | 6.0 | 6.9 | 7.4 | 7.4 | 7.8 | 7.5 | 8.3 | 7.8 | 6.4 |
|  | $Al_2O_3$ | 11.1 | 11.1 | 11.0 | 10.9 | 10.9 | 10.9 | 12.9 | 12.7 | 12.5 | 11.4 |
|  | $K_2O$ |  | 0.17 | 0.17 | 0.17 | 0.17 |  | 0.20 | 0.17 | 0.17 | 0.17 |
|  | MgO |  |  |  |  |  |  |  |  |  |  |
|  | CaO | 11.1 | 11.1 | 11.0 | 10.9 | 9.9 | 10.9 | 11.7 | 11.5 | 11.5 | 9.9 |
|  | SrO |  |  |  |  |  |  |  |  |  |  |
|  | BaO |  |  |  |  |  |  |  |  |  |  |
|  | $SnO_2$ | 0.08 | 0.08 | 0.08 | 0.08 | 0.08 | 0.08 | 0.10 | 0.08 | 0.08 | 0.08 |
|  | $Fe_2O_3$ |  | 0.022 | 0.022 | 0.022 | 0.022 |  | 0.02 | 0.02 | 0.02 | 0.022 |
|  | $(SiO_2 + 2Al_2O_3)/(2B_2O_3 + RO)$ | 4.06 | 4.06 | 3.74 | 3.60 | 3.60 | 3.46 | 3.49 | 3.30 | 3.42 | 4.18 |
|  | $SiO_2 + 2Al_2O_3$ | 93.9 | 93.7 | 92.8 | 92.3 | 92.3 | 92.1 | 93.3 | 92.6 | 92.9 | 94.8 |
|  | $RO + B_2O_3 + ZnO$ | 17.1 | 17.1 | 17.9 | 18.3 | 18.3 | 18.7 | 19.2 | 19.8 | 19.4 | 16.3 |
|  | $Al_2O_3/SiO_2$ | 0.15 | 0.15 | 0.15 | 0.15 | 0.15 | 0.15 | 0.19 | 0.19 | 0.18 | 0.16 |
|  | RO | 11.1 | 11.1 | 11.0 | 10.9 | 10.9 | 10.9 | 11.7 | 11.5 | 11.5 | 9.9 |
|  | $B_2O_3 + P_2O_5$ | 6.0 | 6.0 | 6.9 | 7.4 | 7.4 | 7.8 | 7.5 | 8.3 | 7.8 | 6.4 |
|  | CaO/RO | 1 | 1 | 1 | 1 | 0.91 | 1 | 1 | 1 | 1 | 1 |
|  | $SiO_2—Al_2O_3/2$ | 66.1 | 66.0 | 65.4 | 65.0 | 65.0 | 64.8 | 61.1 | 61.0 | 61.6 | 66.3 |
|  | β-OH | 0.11 | 0.12 | 0.11 | 0.11 | 0.12 | 0.13 | 0.12 | 0.11 | 0.11 | 0.12 |
| Properties | devitrification temperature (° C.) | 1233 | 1230 | 1213 | 1189 | 1206 | 1187 | 1230 | 1220 | 1236 | 1235 |
|  | Tg (° C.) | 782 | 776 | 766 | 758 | 751 | 761 | 763 | 754 | 760 | 781 |
|  | average coefficient of thermal expansion ($\times 10^{-7}$) (100-300° C.) | 34.2 | 34.0 | 32.9 | 32.6 | 33.1 | 33.2 | 36.0 | 35.9 | 36.0 | 33.3 |
|  | a heat shrinkage rate (ppm) | 31 | 36 | 44 | 48 | 52 | 46 | 28 | 33 | 31 | 23 |
|  | density (g/cm$^3$) | 2.41 | 2.41 | 2.40 | 2.39 | 2.39 | 2.38 | 2.40 | 2.41 | 2.42 | 2.38 |
|  | strain point (° C.) | 723 | 716 | 707 | 709 | 704 | 707 | 712 | 702 | 710 | 731 |
|  | melting temperature (° C.) | 1644 | 1632 | 1620 | 1608 | 1609 | 1610 | 1587 | 1582 | 1579 | 1640 |
|  | liquidus viscosity (log η) | 5.0 | 5.0 | 5.1 | 5.2 | 5.0 | 5.2 | 4.6 | 4.7 | 4.6 | 4.9 |
|  | specific resistance (Ω · cm) (1550° C.) | 243 | 193 | 194 | 195 | 194 | 248 | 137 | 133 | 129 | 207 |
|  | etching rate (μm/h) | 65 | 65 | 67 | 69 | 69 | 69 | 80 | 82 | 80 | 64 |

|  |  | Examples | | | Comparative Examples | | | | | |
|---|---|---|---|---|---|---|---|---|---|---|
|  |  | 3-11 | 3-12 | 3-13 | 3-1 | 3-2 | 3-3 | 3-4 | 3-5 | 3-6 |
| Composition (mol %) | $SiO_2$ | 70.5 | 70.5 | 70.5 | 71.7 | 71.7 | 66.4 | 67.64 | 67.64 | 67.64 |
|  | $B_2O_3$ | 7.4 | 7.4 | 7.4 | 4.0 |  | 11.0 | 7.83 | 7.83 | 7.83 |
|  | $Al_2O_3$ | 10.9 | 10.9 | 10.9 | 11.1 | 11.1 | 10.9 | 12.73 | 12.73 | 12.73 |
|  | $K_2O$ | 0.17 | 0.17 | 0.17 |  |  | 0.18 | 0.17 | 0.17 | 0.17 |
|  | MgO | 2.0 |  |  |  |  | 2.8 | 1 | 3 | 5 |
|  | CaO | 8.9 | 9.9 | 8.9 | 13.1 | 17.1 | 6.8 | 10.5 | 8.5 | 6.5 |
|  | SrO |  | 1.0 | 2.0 |  |  | 1.69 |  |  |  |
|  | BaO |  |  |  |  |  |  |  |  |  |
|  | $SnO_2$ | 0.08 | 0.08 | 0.08 | 0.08 | 0.09 | 0.09 | 0.08 | 0.08 | 0.08 |
|  | $Fe_2O_3$ | 0.022 | 0.022 | 0.022 |  |  | 0.03 | 0.022 | 0.022 | 0.022 |
|  | $(SiO_2 + 2Al_2O_3)/(2B_2O_3 + RO)$ | 3.60 | 3.60 | 3.60 | 4.45 | 5.49 | 2.64 | 3.42 | 3.42 | 3.42 |
|  | $SiO_2 + 2Al_2O_3$ | 92.3 | 92.3 | 92.3 | 93.9 | 93.9 | 88.3 | 93.1 | 93.1 | 93.1 |
|  | $RO + B_2O_3 + ZnO$ | 18.3 | 18.3 | 18.3 | 17.1 | 17.1 | 22.3 | 19.4 | 19.4 | 19.4 |
|  | $Al_2O_3/SiO_2$ | 0.15 | 0.15 | 0.15 | 0.15 | 0.15 | 0.16 | 0.19 | 0.19 | 0.19 |
|  | RO | 10.9 | 10.9 | 10.9 | 13.1 | 17.1 | 11.3 | 11.5 | 11.5 | 11.5 |
|  | $B_2O_3 + P_2O_5$ | 7.4 | 7.4 | 7.4 | 4.0 |  | 11.0 | 7.83 | 7.83 | 7.83 |
|  | CaO/RO | 0.82 | 1 | 1 | 1 | 1 | 0.60 | 0.91 | 0.74 | 0.57 |
|  | $SiO_2—Al_2O_3/2$ | 65.0 | 65.0 | 65.0 | 66.1 | 66.1 | 61.0 | 61.3 | 61.3 | 61.3 |
|  | β-OH | 0.12 | 0.12 | 0.12 | 0.13 | 0.11 | 0.11 | 0.11 | 0.11 | 0.12 |
| Properties | devitrification temperature (° C.) | 1201 | 1207 | 1200 | 1282 | 1330 | 1196 | 1260 | 1294 | 1324 |
|  | Tg (° C.) | 742 | 752 | 753 | 786 | 826 | 707 | 758 | 749 | 746 |

TABLE 3-continued

|  |  |  |  |  |  |  |  |  |  |
|---|---|---|---|---|---|---|---|---|---|
| average coefficient of thermal expansion ($\times 10^{-7}$) (100-300° C.) | 30.4 | 35.0 | 35.8 | 29.8 | 41.0 | 34.3 | 34.4 | 33.3 | 32.8 |
| a heat shrinkage rate (ppm) | 39 | 34 | 33 | 17 | 13 | 114 | 32 | 37 | 38 |
| density (g/cm$^3$) | 2.38 | 2.41 | 2.42 | 2.445 | 2.510 | 2.40 | 2.41 | 2.40 | 2.40 |
| strain point (° C.) | 695 | 702 | 703 | 725 | 774 | 660 | 708 | 697 | 691 |
| melting temperature (° C.) | 1614 | 1610 | 1608 | 1675 | 1701 | 1529 | 1585 | 1580 | 1577 |
| liquidus viscosity (log η) | 5.1 | 5.0 | 5.1 | 4.7 | 4.4 | 4.6 | 4.4 | 4.2 | 4.0 |
| specific resistance (Ω · cm) (1550° C.) | 193 | 196 | 197 | 230 | 188 | 165 | 132 | 130 | 128 |
| etching rate (μm/h) | 69 | 69 | 69 | 65 | 65 | 82 | 83 | 81 | 79 |

The flat panel display glass substrate of the present invention is suitable for flat panel displays in which the p-Si is used, and is particularly suitable as a glass substrate for liquid crystal displays and organic EL displays in which the p-Si TFT is used. The flat panel display glass substrate of the present invention is suitable as a display glass substrate for mobile terminals for which a high resolution is required, among other things.

Note that the specific embodiments or examples described in the "DETAILED DESCRIPTION OF THE INVENTION" section are only for the purpose of illustrating the technical aspects of the present invention, and are not to be construed in a narrow sense by limiting the present invention to such specific examples. Various changes and modifications can be made without departing from the spirit and scope of the present invention as set forth in the following claims.

What is claimed is:

1. A method for manufacturing a flat panel display glass substrate, the method comprising:
a melting step of melting a glass material for a glass comprising, as expressed in mol %, 55-80% SiO$_2$, 3-20% Al$_2$O$_3$, 7.8% or less—B$_2$O$_3$, 0-1 mol % La$_2$O$_3$, 0.01-0.3 mol % SnO$_2$, and 3-25% RO (the total amount of MgO, CaO, SrO, and BaO), and substantially no As$_2$O$_3$ and Sb$_2$O$_3$, and the devitrification temperature of the glass being 1150-1240° C. or less, to produce a molten glass,
a forming step of forming the molten glass into a glass plate, and
an annealing step of annealing the glass plate,
wherein:
the contents in mol % of SiO$_2$ and Al$_2$O satisfy a relationship SiO$_2$–(Al$_2$O$_3$/2)=63.6-69,
the strain point of the glass is 716° C. or more,
the devitrification temperature of the glass is 1170° C. or more,
the content of SrO is no less than 0% and less than 3%,
the content of MgO is 5.8 mol % or less,
the density of the glass is 2.6 g/cm$^3$ or less,
the heat shrinkage rate of the glass plate is 75 ppm or less, and
the heat shrinkage rate is calculated from the amount of shrinkage of the glass plate measured after a heat treatment which is performed at a temperature rising and falling rate of 10° C./min and at 550° C. for 2 hours by:

the heat shrinkage rate (ppm)={the amount of shrinkage of the glass plate after the thermal treatment/the length of the glass plate before the heat treatment}$\times 10^6$, wherein in the melting step, the molten glass is produced to have a β-OH of 0.05-0.40 mm$^{-1}$.

2. A method for manufacturing a flat panel display glass substrate, the method comprising:
a melting step of melting a glass material for a glass comprising, as expressed in mol %, 55-80% SiO$_2$, 3-20% Al$_2$O$_3$, 7.8% or less—B$_2$O$_3$, 0-1 mol % La$_2$O$_3$, 0.01-0.3 mol % SnO$_2$ and 3-25% RO (the total amount of MgO, CaO, SrO, and BaO), and substantially no As$_2$O$_3$ and Sb$_2$O$_3$, and the devitrification temperature of the glass being 1150-1240° C. or less, to produce a molten glass,
a forming step of forming the molten glass into a glass plate, and
an annealing step of annealing the glass plate,
wherein:
the contents in mol % of SiO$_2$ and Al$_2$O satisfy a relationship SiO$_2$–(Al$_2$O$_3$/2)=63.6-69,
the strain point of the glass is 716° C. or more,
the devitrification temperature of the glass is 1170° C. or more,
the content of SrO is no less than 0% and less than 3%,
the content of MgO is 5.8 mol % or less,
the density of the glass is 2.6 g/cm$^3$ or less,
the heat shrinkage rate of the glass plate is 75 ppm or less, and
the heat shrinkage rate is calculated from the amount of shrinkage of the glass plate measured after a heat treatment which is performed at a temperature rising and falling rate of 10° C./min and at 550° C. for 2 hours by:

the heat shrinkage rate (ppm)={the amount of shrinkage of the glass plate after the thermal treatment/the length of the glass plate before the heat treatment}$\times 10^6$, wherein in the annealing step, the glass plate is cooled at an average rate of 50-300° C./min within the temperature range of the glass transition temperature (Tg) to Tg−100° C.

* * * * *